(12) United States Patent
Kuznetsov et al.

(10) Patent No.: US 11,460,418 B2
(45) Date of Patent: Oct. 4, 2022

(54) METHODS AND SYSTEMS FOR SEMICONDUCTOR METROLOGY BASED ON WAVELENGTH RESOLVED SOFT X-RAY REFLECTOMETRY

(71) Applicant: KLA Corporation, Milpitas, CA (US)

(72) Inventors: Alexander Kuznetsov, Austin, TX (US); Chao Chang, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 598 days.

(21) Appl. No.: 16/551,616

(22) Filed: Aug. 26, 2019

(65) Prior Publication Data
US 2021/0063329 A1 Mar. 4, 2021

(51) Int. Cl.
*G01N 23/20* (2018.01)
*G01N 23/20008* (2018.01)
*G01N 23/205* (2018.01)
*H01L 21/66* (2006.01)

(52) U.S. Cl.
CPC ............ *G01N 23/20* (2013.01); *G01N 23/205* (2013.01); *G01N 23/20008* (2013.01); *H01L 22/12* (2013.01); *G01N 2223/052* (2013.01); *G01N 2223/0561* (2013.01); *G01N 2223/1016* (2013.01); *G01N 2223/206* (2013.01);
(Continued)

(58) Field of Classification Search
None
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |
| 6,429,943 B1 | 8/2002 | Opsal et al. |

(Continued)

OTHER PUBLICATIONS

International Search Report dated Oct. 13, 2020, for PCT Application No. PCT/US2020/043653 filed on Jul. 26, 2020 by KLA-Tencor Corporation, 3 pages.
(Continued)

*Primary Examiner* — Thomas R Artman
(74) *Attorney, Agent, or Firm* — Spano Law Group; Joseph S. Spano

(57) ABSTRACT

Methods and systems for measuring structural and material characteristics of semiconductor structures based on wavelength resolved, soft x-ray reflectometry (WR-SXR) at multiple diffraction orders are presented. WR-SXR measurements are simultaneous, high throughput measurements over multiple diffraction orders with broad spectral width. The availability of wavelength resolved signal information at each of the multiple diffraction orders improves measurement accuracy and throughput. Each non-zero diffraction order includes multiple measurement points, each different measurement point associated with a different wavelength. In some embodiments, WR-SXR measurements are performed with x-ray radiation energy in a range of 10-5,000 electron volts at grazing angles of incidence in a range of 1-45 degrees. In some embodiments, the illumination beam is controlled to have relatively high divergence in one direction and relatively low divergence in a second direction, orthogonal to the first direction. In some embodiments, multiple detectors are employed, each detecting different diffraction orders.

22 Claims, 15 Drawing Sheets

(52) U.S. Cl.
CPC ............... *G01N 2223/6116* (2013.01); *G01N 2223/645* (2013.01)

(56) References Cited

U.S. PATENT DOCUMENTS

| | | | |
|---|---|---|---|
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,035,375 B2* | 4/2006 | Yokhin | G01N 23/201 378/89 |
| 7,209,542 B2* | 4/2007 | Lee | G01N 23/207 378/70 |
| 7,406,153 B2* | 7/2008 | Berman | G01N 23/20 378/89 |
| 7,478,019 B2 | 1/2009 | Zangooie et al. | |
| 7,755,764 B2 | 7/2010 | Kwak et al. | |
| 7,826,071 B2 | 11/2010 | Shchegrov et al. | |
| 7,907,264 B1 | 3/2011 | Krishnan | |
| 7,920,676 B2* | 4/2011 | Yun | G01N 23/201 378/70 |
| 7,929,667 B1 | 4/2011 | Zhuang et al. | |
| 7,933,026 B2 | 4/2011 | Opsal et al. | |
| 8,749,179 B2 | 6/2014 | Liu et al. | |
| 8,860,937 B1 | 10/2014 | Dziura et al. | |
| 8,879,073 B2 | 11/2014 | Madsen et al. | |
| 8,941,336 B1 | 1/2015 | Liu et al. | |
| 9,588,066 B2* | 3/2017 | Pois | G01N 23/207 |
| 9,915,522 B1 | 3/2018 | Jiang et al. | |
| 10,041,873 B2 | 8/2018 | Krishnan | |
| 10,060,865 B2* | 8/2018 | Ruth | G01N 23/207 |
| 10,067,074 B2* | 9/2018 | Quintanilha | G01N 21/8806 |
| 10,145,674 B2 | 12/2018 | Krishnan | |
| 10,281,263 B2 | 5/2019 | Krishnan | |
| 10,996,568 B2* | 5/2021 | Smorenburg | G03F 7/70033 |
| 11,099,142 B2* | 8/2021 | Barak | G06T 5/002 |
| 2005/0094766 A1* | 5/2005 | Yokhin | G01N 23/201 378/86 |
| 2006/0126786 A1* | 6/2006 | Lee | G01N 23/207 378/70 |
| 2007/0224518 A1 | 9/2007 | Yokhin et al. | |
| 2008/0273662 A1 | 11/2008 | Yun et al. | |
| 2013/0114085 A1 | 5/2013 | Wang et al. | |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0246607 A1 | 9/2014 | Bykanov et al. | |
| 2014/0297211 A1 | 10/2014 | Pandev et al. | |
| 2014/0306115 A1 | 10/2014 | Kuritsyn et al. | |
| 2014/0316730 A1 | 10/2014 | Shchegrov et al. | |
| 2015/0008335 A1 | 1/2015 | Bykanov et al. | |
| 2015/0042984 A1 | 2/2015 | Pandev et al. | |
| 2015/0046118 A1 | 2/2015 | Pandev et al. | |
| 2015/0076359 A1 | 3/2015 | Bykanov et al. | |
| 2015/0110249 A1 | 4/2015 | Bakeman et al. | |
| 2015/0117610 A1 | 4/2015 | Veldman et al. | |
| 2015/0199463 A1 | 7/2015 | Iloreta et al. | |
| 2015/0204664 A1 | 7/2015 | Bringoltz et al. | |
| 2015/0204802 A1* | 7/2015 | Pois | G01N 23/207 378/86 |
| 2015/0300965 A1 | 10/2015 | Sezginer | |
| 2016/0128171 A1 | 5/2016 | Kuritsyn et al. | |
| 2016/0202193 A1 | 7/2016 | Hench et al. | |
| 2016/0216197 A1 | 7/2016 | Bringoltz et al. | |
| 2016/0249442 A1 | 8/2016 | Kuritsyn et al. | |
| 2016/0266056 A1* | 9/2016 | Ruth | G01N 23/207 |
| 2016/0282282 A1* | 9/2016 | Quintanilha | G03F 7/2004 |
| 2017/0167862 A1 | 6/2017 | Dziura et al. | |
| 2017/0357155 A1 | 12/2017 | Quintanilha et al. | |
| 2018/0059019 A1 | 3/2018 | Houssam et al. | |
| 2018/0106735 A1 | 4/2018 | Gellineau et al. | |
| 2018/0156597 A1 | 6/2018 | Smith et al. | |
| 2019/0017946 A1 | 1/2019 | Wack et al. | |
| 2019/0033236 A1* | 1/2019 | Barak | G06T 5/002 |
| 2019/0212281 A1 | 7/2019 | Shchegrov et al. | |
| 2019/0215940 A1 | 7/2019 | Khodykin et al. | |
| 2020/0201192 A1* | 6/2020 | Smorenburg | G03F 7/70625 |
| 2021/0063329 A1* | 3/2021 | Kuznetsov | G01N 23/205 |
| 2022/0042934 A1* | 2/2022 | Barak | G06T 5/002 |

OTHER PUBLICATIONS

Lemaillet, et al., "Intercomparison between optical and x-ray scatterometry measurements of FinFET structures," Proc. SPIE, v. 8681, p. 86810Q, 2013.

Kline, et al., "X-ray scattering critical dimensional metrology using a compact x-ray source for next generation semiconductor devices," J. of Micro/Nanolithography, MEMS, and MOEMS, 16(1), 014001 (2017).

* cited by examiner

METHODS AND SYSTEMS FOR SEMICONDUCTOR METROLOGY BASED ON WAVELENGTH RESOLVED SOFT X-RAY REFLECTOMETRY

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

Accurate information concerning the material composition and shape of nanostructures is limited in the process development environment of a leading-edge front-end semiconductor fabrication facility. Scatterometric optical metrology systems rely on accurate geometric and dispersion models to avoid measurement bias. With limited knowledge of material composition and shape of nanostructures available apriori, measurement recipe development and validation is a slow and tedious process. For example, cross-sectional transmission electron microscopy (TEM) images are used to guide optical scatterometry model development, but TEM imaging is slow and destructive.

Scatterometric optical metrology tools utilizing infrared to visible light measure zero-order diffraction signals from sub-wavelength structures. As device critical dimensions continue to shrink scatterometric optical metrology sensitivity and capability is decreasing. Furthermore, when absorbing materials are present in the structure under measurement, penetration and scattering of illumination light in the optical region (e.g., 0.5-10 ev) limits the utility of conventional optical metrology systems.

Similarly, electron beam based metrology systems struggle to penetrate semiconductor structures due to absorption and scattering of the illuminating, backscattered, and secondary emission electrons.

Atomic force microscopes (AFM) and scanning-tunneling microscopes (STM) are able to achieve atomic resolution, but they can only probe the surface of the specimen. In addition, AFM and STM microscopes require long scanning times that make these technologies impractical in a high volume manufacturing (HVM) setting.

Transmission, Small-Angle X-Ray Scatterometry (T-SAXS) systems employing photon at a hard X-ray energy level (>15 keV) have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2) U.S. Patent Publication No. 2014/0019097 by Bakeman, Shchegrov, Zhao, and Tan, entitled "Model Building And Analysis Engine For Combined X-ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-ray Metrology," 4) U.S. Patent Publication No. 2016/0202193 by Hench, Shchegrov, and Bakeman, entitled "Measurement System Optimization For X-ray Based Metrology," 5) U.S. Patent Publication No. 2017/0167862 by Dziura, Gellineau, and Shchegrov, entitled "X-ray Metrology For High Aspect Ratio Structures," and 6) U.S. Patent Publication No. 2018/0106735 by Gellineau, Dziura, Hench, Veldman, and Zalubovsky, entitled "Full Beam Metrology for X-ray Scatterometry Systems." The aforementioned patent documents are assigned to KLA-Tencor Corporation, Milpitas, Calif. (USA), the contents of each are incorporated herein by reference in their entirety.

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en).

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and X-ray scatterometry measurements of FinFET structures" by Lemaillet, Germer, Kline et al., Proc. SPIE, v.8681, p. 86810Q (2013). More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact X-ray source for next generation semiconductor devices," J. Micro/Nanolith. MEMS MOEMS 16(1), 014001 (January-March 2017).

However, scattering of hard x-rays from shallow structures, e.g., logic metrology applications, is weak, which severely limits achievable measurement resolution and throughput. As such, T-SAXS has not been shown to be a viable option for logic metrology applications in an HVM environment.

T-SAXS systems achieve a small beam footprint on the wafer due to near-normal incidence illumination. However, T-SAXS systems require high energy photons (e.g., >16 keV) for adequate transmission through a wafer under measurement. Typically diffraction efficiency scales with photon energy, E, as $1/E^2$ and angular separation of diffraction orders scales at $1/E$. To avoid order overlap for a 2D-periodic structure, the solid-angular acceptance scales as $1/E^2$. These scaling factors impose a strong penalty on T-SAXS systems for metrology of shallow structures.

In addition, the diffraction patterns from all previous patterned steps are superimposed on the diffraction pattern of the current layer structure in a transmission measurement. Since the minimum pitch (i.e., period) of critical metal layers is expected to converge to values differing by only 10-20%, angular acceptance is severely restricted to separate diffraction signals at the detector. Otherwise, the geometric information of all previous layers must be fed-forward to the metrology system characterizing the current layer. Typically, within the context of a complex HVM environment, it is very difficult to obtain and manage the required metrology and process information.

Conventional GI-SAXS systems operate near the critical angles for reflection (e.g., grazing angle of less than one degree) for semiconductor materials and photon energies above 8 keV to maximize diffracted intensity. This leads to an extremely large illumination beam spot size projected onto the wafer (e.g., greater than 1 mm). This is so large that even scribe-line metrology targets are unuseable. Thus, extremely large, specialized metrology targets must be constructed on the wafer to perform GI-SAXS measurements. This loss of functional wafer real estate is costly. In addition, the surface sensitivity of GI-SAXS measurements is excellent, but penetration of high aspect ratio structures is very limited due to evanescent field behavior.

U.S. Patent Publication No. 2017/0357155A1 by Quintanilha et al., entitled "Metrology Methods, Metrology Apparatus, and Device Manufacturing Method," describes a system that employs a spectrometer type detector to generate a wavelength resolved signal in the 0th order. This approach requires the use of a diffraction element (e.g., diffraction grating) in the collection path between the wafer and photosensitive detection elements to separate signals of different wavelengths. This limits the types of detectors, which may be employed to perform the spectral measurements.

In summary, there is a need for a dimensional metrology system having measurement capability for both low and high aspect ratio structures and an illumination beam spot size compatible with scribe-line targets. In one example, there is a need for a metrology system to estimate shape and edge placement parameters of high aspect ratio (HAR) structures at HVM throughputs. In addition, it should be possible to develop and validate measurement recipes for the metrology system and operate the metrology system in a high volume manufacturing (HVM) environment without substantial prior dimensional and material composition information.

SUMMARY

Methods and systems for measuring structural and material characteristics of semiconductor structures based on wavelength resolved, soft x-ray reflectometry (WR-SXR) at multiple diffraction orders are presented herein. The methods and systems described herein provide simultaneous, high throughput measurements over multiple diffraction orders with broad spectral width. The availability of wavelength resolved signal information at each of the multiple diffraction orders improves measurement accuracy and throughput.

In general, WR-SXR measurements of a semiconductor wafer are performed over a range of wavelengths, angles of incidence, and azimuth angles with a small beam spot size. In one aspect, the WR-SXR measurements are performed with x-ray radiation in the soft x-ray (SXR) region (i.e., 10-5,000 eV) at grazing angles of incidence in the range of 1-45 degrees.

In general, the $0^{th}$ order reflected beam will have divergence similar to the divergence of the incident illumination beam. Radiation scattered into non-zero diffraction orders has higher divergence than the incident illumination beam because the incident illumination beam includes multiple wavelengths each diffracting at a slightly different angle within each of the non-zero diffraction orders. The angle of reflection for non-zero diffraction orders depends on the wavelength of the incident illumination beam. For an incident illumination beam having multiple, discrete illumination wavelengths, the scattered light includes multiple angles of reflection within each non-zero diffraction order. Similarly, for an incident illumination beam having a continuous, broadband spectrum, the scattered light includes a continuous spatial spread of reflected light at incidence with the detector within each non-zero diffraction order. Hence, each non-zero diffraction order includes multiple measurement points, each different measurement point associated with a different wavelength. Thus, each non-zero diffraction order includes a wavelength-resolved spectrum. In this manner, a WR-SXR metrology system provides wavelength resolved signal information without employing a diffracting optical element in the optical path between the target under measurement and the detector.

A WR-SXR system is employed to determine properties of a specimen (e.g., structural parameter values) based on wavelength resolved signal information at one or more non-zero diffraction orders of scattered light.

In one aspect, the distance between the detector and the wafer under measurement is actively adjusted to change the resolution of the spectral information collected at the detector.

In another further aspect, focusing optics collect source emission and select one or more discrete wavelengths or spectral bands, and focus the selected light onto a specimen at grazing angles of incidence in the range 1-45 degrees.

In another further aspect, the ranges of wavelengths, AOI, Azimuth, or any combination thereof, projected onto the same metrology area, are adjusted by actively positioning one or more mirror elements of the focusing optics.

In another further aspect, an WR-SXR metrology system includes one or more beam slits or apertures to shape the illumination beam incident on a specimen and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to limit overlap of diffraction orders on the detector.

In another further aspect, a WR-SXR metrology system employs one or more mechanisms to control illumination beam energy. In general, illumination beam energies are selected to ensure adequate X-ray penetration into the particular sample under measurement.

In another further aspect, the incident illumination beam of a WR-SXR metrology system is controlled to have relatively high divergence in one direction across the incident illumination beam and relatively low divergence in a second direction across the incident illumination beam, orthogonal to the first direction. In this manner, the spatial spread across the active surface of the detector in the direction of high divergence is orthogonal to the spatial spread across the active surface of the detector in the direction of low divergence. The spatial spread across the active surface of the detector in the direction of high divergence is dominated by angle of incidence due to relatively high divergence. Whereas, the spatial spread across the active surface of the detector in the direction of low divergence is dominated by wavelength dispersion within each diffraction order as described hereinbefore. In this manner, each non-zero diffraction order includes signal information about the structure under measurement due to spectral reflectivity (in the direction of low divergence) and angular reflectivity (in the direction of high divergence).

In another further aspect, measurement performance is improved by flowing one or more liquid materials or one or more gaseous materials onto the target under measurement to increase contrast between measured materials.

In another further aspect, a WR-SXR metrology system employs multiple detectors. In some embodiments, one or more diffraction orders are collected by a first detector, and other diffraction orders are collected by another detector.

In another further aspect, the position of a detector of a WR-SXR metrology system is actively controlled to capture radiation reflected by the target under measurement.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for measuring structural and material characteristics (e.g., material composition, dimensional characteristics of structures and films, etc.) of semiconductor structures associated with different semiconductor fabrication processes based on x-ray illumination are presented. More specifically, methods and systems for performing measurements of semiconductor structures based on wavelength resolved, soft x-ray reflectometry (WR-SXR) at multiple diffraction orders are presented herein. The methods and systems described herein provide simultaneous, high throughput measurements over multiple diffraction orders with broad spectral width. The availability of wavelength resolved signal information at each of the multiple diffraction orders improves measurement accuracy and throughput.

In general, WR-SXR measurements of a semiconductor wafer are performed over a range of wavelengths, angles of incidence, and azimuth angles with a small beam spot size (e.g., less than 50 micrometers across the effective illumination spot). In one aspect, the WR-SXR measurements are performed with x-ray radiation in the soft x-ray (SXR) region (i.e., 10-5,000 eV) at grazing angles of incidence in the range of 1-45 degrees. Grazing angles for a particular measurement application are selected to achieve a desired penetration into the structure under measurement and maximize measurement information content with a small beam spot size (e.g., less than 50 micrometers).

Figure 1:
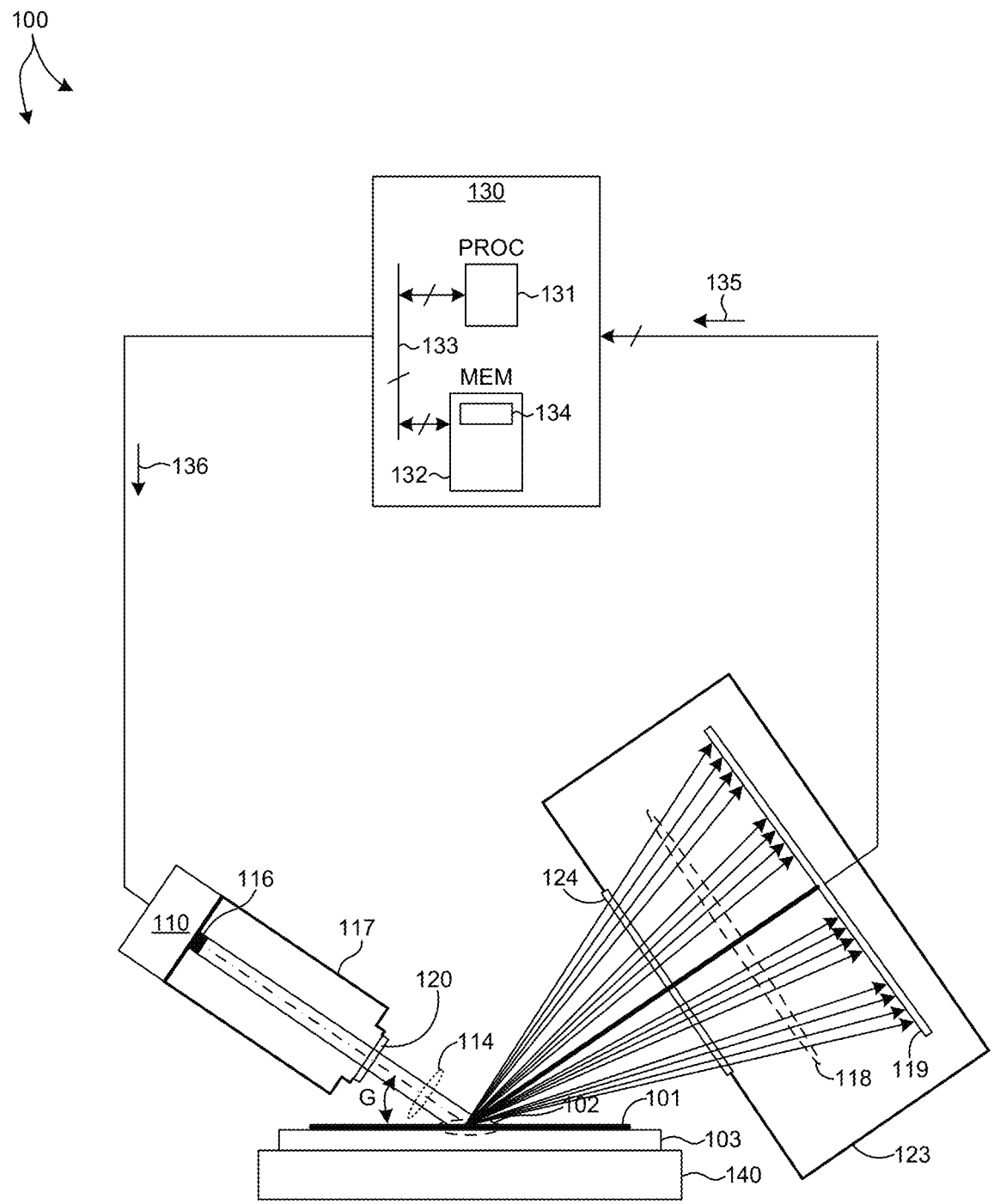
FIG. 1 depicts an illustration of a wavelength resolved, soft x-ray reflectometry (WR-SXR) based metrology tool for measuring characteristics of a specimen in one embodiment.

FIG. 1 illustrates an embodiment of a WR-SXR metrology tool 100 for measuring characteristics of a specimen in at least one novel aspect. As shown in FIG. 1, the system 100 may be used to perform WR-SXR measurements over a measurement area including a periodic target 102 disposed on a specimen 101.

Illumination source 110 generates illumination radiation at multiple wavelengths. In the embodiment depicted in FIG. 1, illumination source 110 generates broadband illumination directed to periodic target 102 (e.g., periodic grating) disposed on specimen 101 at grazing angle, G. In the embodiment depicted in FIG. 1, the periodic target 102 is periodic in one direction (i.e., the horizontal direction across the drawing). The periodic target extends uniformly, without periodicity, in the orthogonal direction (i.e., the direction perpendicular to the drawing sheet). FIG. 1 depicts a periodic target having periodicity in one direction by way of non-limiting example. In general, the metrology methods and systems described herein are applicable to the measurement of periodic targets having periodicity in two directions (e.g., two orthogonal directions).

In the embodiment depicted in FIG. 1, illumination source 110 is a high harmonic generation (HHG) laser illumination source having a small illumination source area (less than 50 micrometers). In one example, HHG laser illumination source 110 generates an illumination beam 114 having low beam divergence (e.g., less than 1 milliradian) in two orthogonal directions across the beam. Illumination beam 114 is projected onto periodic target 102, and in response, radiation 118 is scattered from periodic target 102 and detected by detector 119.

Figure 2:
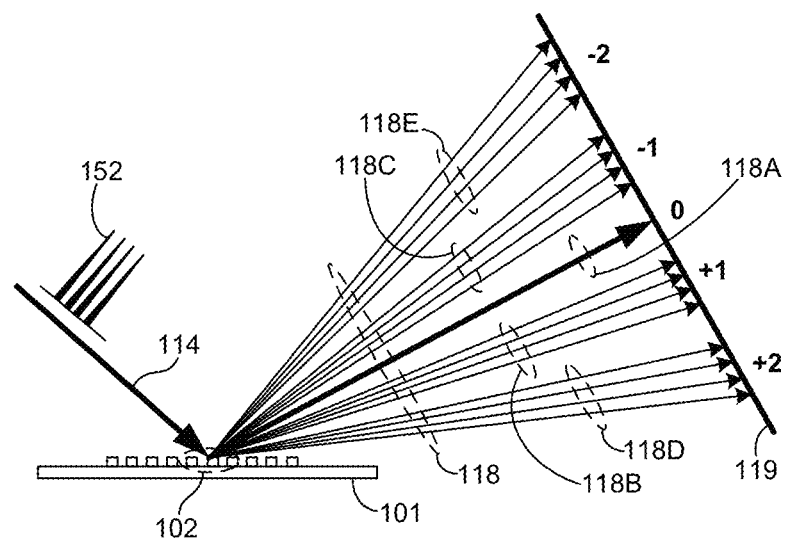
FIG. 2 depicts an illustration of radiation scattered from a periodic target and detected by a detector of a WR-SXR metrology system in one embodiment.

FIG. 2 depicts radiation 118 scattered from periodic target 102 and detected by detector 119 in greater detail. As depicted in FIG. 2, the wavelength spectrum 152 of illumination beam 114 includes a number of discrete wavelengths. Scattered radiation 118 includes radiation scattered from periodic target 102 into different diffraction orders. The reflected beam 118A is the $0^{th}$ order reflection from periodic target 102. The diffracted radiation 118B corresponds to the +1 diffraction order. The diffracted radiation 118C corresponds to the −1 diffraction order. The diffracted radiation 118D corresponds to the +2 diffraction order. The diffracted radiation 118E corresponds to the −2 diffraction order. The diffracted radiation 118F (not shown) corresponds to the +3 diffraction order. The diffracted radiation 118G (not shown) corresponds to the −3 diffraction order. The diffracted radiation 118H (not shown) corresponds to the +4 diffraction order. The diffracted radiation 118I (not shown) corresponds to the −4 diffraction order. As depicted in FIG. 2, each discrete wavelength present in the illumination beam 114 diffracts at a different angle from periodic target 102 within each of the non-zero diffraction orders.

In general, the $0^{th}$ order beam 118A will have divergence similar to the divergence of the incident illumination beam 114. The portions of scattered radiation 118 scattered into non-zero diffraction orders has higher divergence than the incident illumination beam 114 because the incident illumination beam 114 includes multiple wavelengths each diffracting at a slightly different angle within each of the non-zero diffraction orders. In general, the reflected angles are given by the diffraction grating equation (1);

$$a*\lambda = d*[\sin(\Theta_o) + \sin(\Theta_a)] \quad (1)$$

where λ is the wavelength of the incident illumination beam, d is the grating period, a is the diffraction order, $\Theta_o$ is the angle of incidence, and $\Theta_a$ is the angle of diffracted light. The nominal angle of incidence (depicted as angle, G, in FIG. 1) is any suitable grazing angle of incidence (i.e. angle between wafer plane and the incident illumination beam) between 1 degree and 45 degrees.

As illustrated by equation (1), the angle of reflection associated with the 0th diffraction order (a=0) is equal to the angle of incidence regardless of wavelength. However, the angle of reflection for non-zero diffraction orders (a≠0) depends on the wavelength of the incident illumination beam. For an incident illumination beam having multiple, discrete illumination wavelengths, the scattered light includes multiple angles of reflection within each non-zero diffraction order. Similarly, for an incident illumination beam having a continuous, broadband spectrum, the scattered light includes a continuous spatial spread of reflected light at incidence with detector 119 within each non-zero diffraction order.

As depicted in FIG. 2, the wavelength spectrum 152 of illumination beam 114 includes four discrete wavelengths, and each non-zero diffraction order includes each of the four discrete wavelengths incident on detector 119 at different locations. In this manner, detector 119 distinctly resolves radiation scattered from periodic target 102 at each discrete wavelength within each non-zero diffraction order. Measurements performed with multiple discrete illumination wavelengths may be preferred in certain measurement applications, e.g., when measuring 3D gratings.

Figure 3:
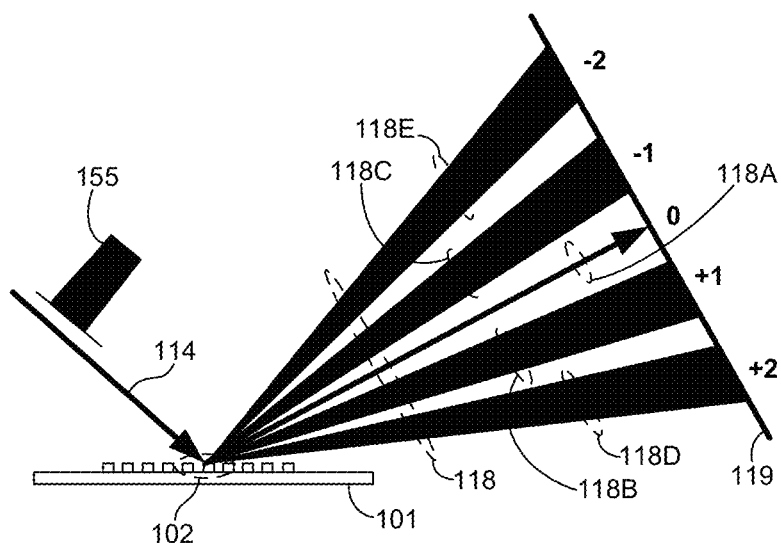
FIG. 3 depicts an illustration of radiation scattered from a periodic target and detected by a detector of a WR-SXR metrology system in another embodiment.

As depicted in FIG. 3, the wavelength spectrum 155 of illumination beam 114 includes a continuous, broadband spectrum, and the scattered light within each non-zero diffraction order includes a continuous spatial spread of reflected light at detector 119 within each non-zero diffraction order. Each distinct wavelength of reflected light is incident on detector 119 at different locations within each non-zero diffraction order. In this manner, detector 119 distinctly resolves radiation scattered from periodic target 102 at each distinct wavelength within each non-zero diffraction order.

As depicted in FIGS. 2 and 3, non-zero diffraction orders each include different reflected wavelengths landing at different location on the photosensitive surface of detector 119. Thus, each non-zero diffraction order includes multiple measurement points, each different measurement point associated with a different wavelength. Thus, each non-zero diffraction order includes a wavelength-resolved spectrum. In this manner, the WR-SXR metrology system provides wavelength resolved signal information without employing a diffracting optical element in the optical path between the target under measurement and the detector. The detection of the spatial spread of each diffraction order according to wavelength at the surface of the detector provides useful and unique information about the measured structure of interest and further enhances measurement performance.

Figure 4:
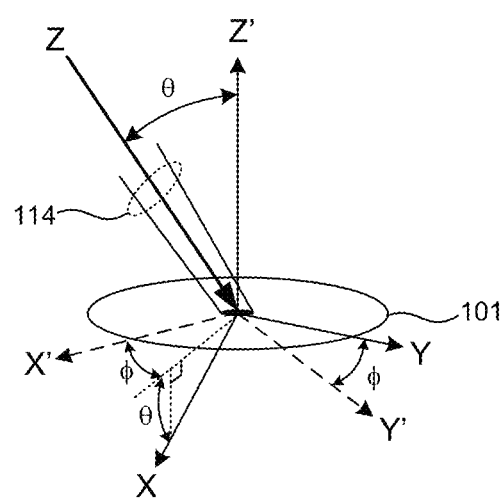
FIG. 4 depicts an illustration of an illumination beam incident on a wafer at a particular orientation described by an angle of incidence, θ, and an azimuth angle, φ.

Each orientation of the incident illumination beam 114 relative to the surface normal of a semiconductor wafer 101 is described by any two angular rotations of wafer 101 with respect to the illumination beam 114, or vice-versa. In one example, the orientation can be described with respect to a coordinate system fixed to the wafer. FIG. 4 depicts illumination beam 114 incident on wafer 101 at a particular orientation described by an angle of incidence, θ, and an azimuth angle, ϕ. Coordinate frame XYZ is fixed to the metrology system (e.g., illumination beam 114) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 4, x-ray illumination beam 114 is aligned with the Z-axis and thus lies within the XZ plane. Angle of incidence, θ, describes the orientation of the x-ray illumination beam 114 with respect to the surface normal of the wafer in the XZ plane. Furthermore, azimuth angle, ϕ, describes the orientation of the XZ plane with respect to the X'Z' plane.

Together, θ and φ, uniquely define the orientation of the x-ray illumination beam 114 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

Figure 5:
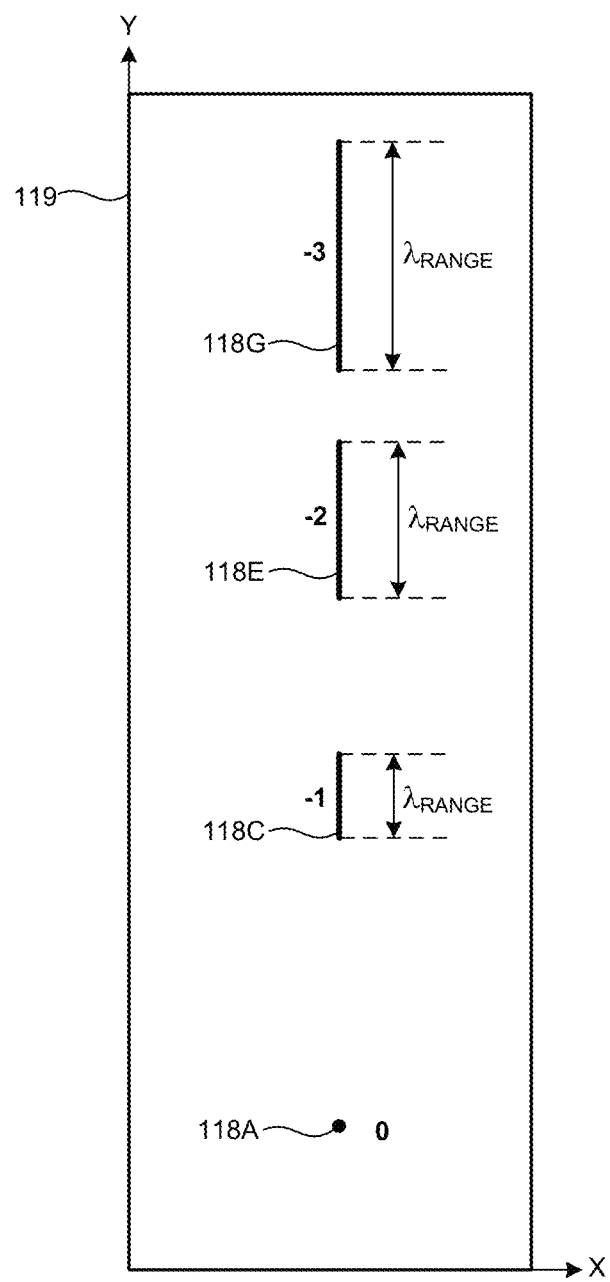
FIG. 5 depicts an illustration of a portion of scattered radiation incident on the active surface of the detector depicted in FIG. 3.

In the examples depicted in FIGS. 2 and 3, the azimuth angle is such that the incident illumination beam 114 illuminates periodic target 102 in a direction that is aligned with the direction of periodicity of the periodic target 102 (the horizontal direction across the drawing sheet), and orthogonal with the direction of uniform extent of the periodic target (the direction normal to the drawing sheet). FIG. 5 depicts a portion of scattered radiation 118 incident on the active surface of detector 119 as measured under the illumination conditions depicted in FIG. 3. More specifically, FIG. 5 depicts, the $0^{th}$ order reflected beam 118A, diffracted radiation 118C corresponding to the −1 diffraction order, diffracted radiation 118E corresponding to the −2 diffraction order, and diffracted radiation 118G corresponding to the −3 diffraction order. As depicted in FIG. 5, each wavelength present in the illumination beam diffracts at a different angle from periodic target 102 within each of the non-zero diffraction orders. Thus, the range of wavelengths, $\lambda_{RANGE}$, present in illumination beam 114 is spatially spread in the y-direction for each of the non-zero diffracted orders.

Figure 6:
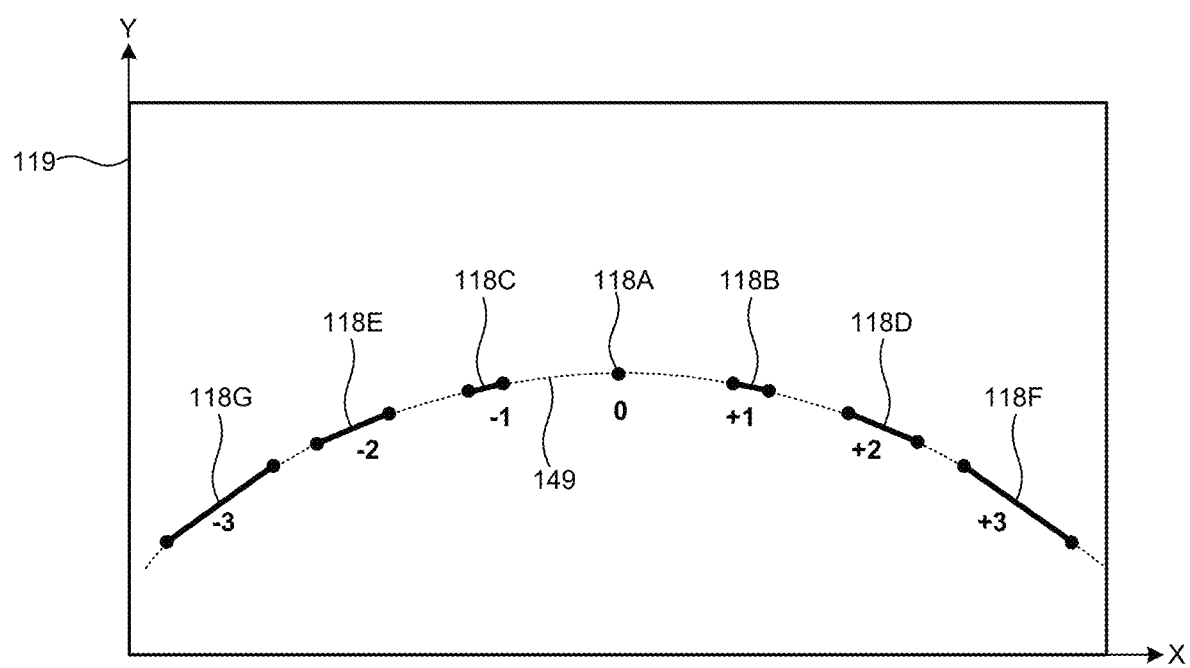
FIG. 6 depicts an illustration of a portion of scattered radiation incident on the active surface of a detector in another example.

In another example, the azimuth angle is such that the incident illumination beam 114 illuminates periodic target 102 in a direction that is aligned with the direction of uniform extent of the periodic target (the direction normal to the drawing sheet of FIG. 3) and orthogonal to the direction of periodicity of the periodic target 102 (the horizontal direction across the drawing sheet of FIG. 3). FIG. 6 depicts a portion of scattered radiation 118 incident on the active surface of detector 119 as measured under these illumination conditions. More specifically, FIG. 6 depicts, the $0^{th}$ order reflected beam 118A, diffracted radiation 118B and 118C corresponding to the +1 and −1 diffraction orders, respectively, diffracted radiation 118D and 118E corresponding to the +2 and −2 diffraction orders, respectively, and diffracted radiation 118F and 118G corresponding to the +3 and −3 diffraction orders, respectively. As depicted in FIG. 6, each wavelength present in the illumination beam diffracts at a different angle from periodic target 102 within each of the non-zero diffraction orders. Thus, the range of wavelengths, $\lambda_{RANGE}$, present in illumination beam 114 is spatially spread across the active surface of detector 119 along arc 149 for each of the non-zero diffracted orders.

In a further aspect, the distance between the detector and the wafer under measurement is actively adjusted to change the resolution of the spectral information collected at the detector. In some embodiments, an actuator (not shown) is configured to move detector 119 in response to a control command (not shown) communicated from computing system 130 to the actuator. Movement of the detector away from the wafer under measurement increases the resolution of the collected spectral information, i.e., increasing spatial separation between any two different wavelengths at the detector with increasing distance. Conversely, movement of the detector toward the wafer under measurement decreases the resolution of the collected spectral information, i.e., decreasing spatial separation between any two different wavelengths at the detector with decreasing distance.

The x-ray illumination source 110 is configured to generate SXR radiation suitable for WR-SXR measurements. X-ray illumination source 110 is a polychromatic, high-brightness, large etendue source. In some embodiments, the x-ray illumination source 110 is configured to generate x-ray radiation in a range between 10-5,000 electron-volts. In general, any suitable high-brightness x-ray illumination source capable of generating high brightness SXR at flux levels sufficient to enable high-throughput, inline metrology may be contemplated to supply x-ray illumination for WR-SXR measurements. Some examples of suitable X-ray illumination sources include rotating anode sources, solid anode sources, particle accelerator sources, microfocus sources, laser produced plasma sources, liquid metal jet sources, gas jet/capillary/cell sources, inverse Compton scattering sources (ICS), compact storage ring sources (CSR), electrical discharge produced plasma sources (DPP), high harmonic generation sources (HHG), an HHG source with an enhancement cavity (HHG+), and soft X-ray laser sources.

Suitable X-ray illumination sources are described in U.S. Patent Publication No. 2019/0215940, U.S. Patent Publication No. 2016/0249442, U.S. Patent Publication No. 2016/0128171, U.S. Patent Publication No. 2015/0076359, U.S. Patent Publication No. 2015/0008335, U.S. Patent Publication No. 2014/0306115, and U.S. Patent Publication No. 2014/0246607, the contents of each are incorporated herein by reference in their entirety.

In some embodiments, illumination source 110 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some embodiments, illumination source 110 is an electron beam source configured to bombard solid, liquid, or gas targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In some embodiments, illumination source 110 is a laser produced plasma (LPP) light source. In some of these embodiments the LPP light source includes any of Xenon, Krypton, Argon, Neon, Nitrogen, Alcohol, and Water emitting materials. In general, the selection of a suitable LPP target material is optimized for brightness in resonant SXR regions. For example, plasma emitted by Krypton provides high brightness at the Silicon K-edge. In another example, plasma emitted by Xenon provides high brightness through the SXR region, e.g., 80-3000 eV. As such, Xenon is a good choice of emitting material when broadband SXR illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. Patent Publication No. 2019/0215940, the content of which is incorporated herein by reference in its entirety.

In some embodiments, a suitable illumination source is broadband. However, in some other embodiments, a suitable illumination source is not broadband, but includes multiple, discrete radiation wavelengths (e.g., a HHG source). In some of these embodiments, reflectivity for each diffraction order includes several images, one for each discrete wavelength. In some embodiments, multiple neighboring harmonics generated by a HHG source are provided to the periodic target, and a set of discrete points at the photosensitive surface of the detector converge into a larger image.

An illumination source having a low divergence (e.g., less than 1 milliradian) is preferred to generate wavelength resolved signal information as described herein. A low divergence illumination source is advantageous in some measurement applications (e.g., when measuring 3D gratings). Although, a high divergence source may be employed, it may require additional optical elements in the optical path from the illumination source to the detector to obtain wavelength resolved signal information. This adds additional cost, complexity, and photon loss to metrology system.

In some embodiments, a broadband source that emits soft X-rays along with light at longer wavelengths (e.g., deep UV, vacuum UV, visible, or IR) is employed as the illumination source of the metrology system.

X-ray illumination source 110 produces x-ray emission over a source area having finite lateral dimensions (i.e., non-zero dimensions orthogonal to the beam axis. In one aspect, the source area of illumination source 110 is characterized by a lateral dimension of less than 20 micrometers. In some embodiments, the source area is characterized by a lateral dimension of 10 micrometers or less. In some embodiments, the source area is characterized by a lateral dimension of 5 micrometers or less. Small source size enables illumination of a small target area on the specimen with high brightness, thus improving measurement precision, accuracy, and throughput based on measurements of small metrology targets. In some embodiments, a small (<5 micrometer diameter) illumination source size enables a scanning metrology system with sub-micron resolution.

X-ray detector 119 collects x-ray radiation 118 scattered from specimen 101 and generates output signals 135 indicative of properties of specimen 101 that are sensitive to the incident x-ray radiation in accordance with a WR-SXR measurement modality. In some embodiments, scattered x-rays 118 are collected by x-ray detector 119 while specimen positioning system 140 locates and orients specimen 101 to produce angularly resolved scattered x-rays. In some embodiments, signal information about sample uniformity is obtained by collecting signal at different locations across specimen 101.

In general, any suitable type of X-ray detector might be utilized to perform WR-SXR measurements as described herein. Exemplary detectors include a Charge Coupled Device (CCD), a Gas Electron Multiplier (GEM), a microstrip proportional counter, a gas filled proportional counter, a cadmium telluride (CdTe) detector, a Pixel Array Detector (PAD), an Avalanche Photodiode (APD), a PIN diode array, a photodiode array, a Photomultiplier Tube (PMT), a multi-channel plate together with a CCD detector, a complementary metal oxide semiconductor (CMOS) detector, a scintillator together with a high speed CMOS detector, a CMOS Active Pixel Sensor (APS), etc.

In some embodiments, a WR-SXR system includes one or more photon counting detectors with high dynamic range (e.g., greater than $10^5$). In some embodiments, the x-ray detector resolves one or more x-ray photon energies and produces signals for each x-ray energy component indicative of properties of the specimen. In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

In a further aspect, a WR-SXR system is employed to determine properties of a specimen (e.g., structural parameter values) based on wavelength resolved signal information at one or more non-zero diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on WR-SXR involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength, x-ray incidence angle relative to the wafer surface normal, or a combination thereof are collected. Wavelength resolved signal information contained in the multiple diffraction orders is typically unique between each model parameter under consideration. Thus, x-ray scattering yields estimation results for values of parameters of interest with small errors and reduced parameter correlation.

In one aspect, metrology tool 100 includes a wafer chuck 103 that fixedly supports wafer 101 and is coupled to specimen positioning system 140. Specimen positioning system 140 configured to actively position specimen 101 in six degrees of freedom with respect to illumination beam 114. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

In some examples, measurements are performed over a range of angles of incidence, azimuth angles, and locations on the wafer to provide different illumination and collection angles optimized to improve measurement performance.

In some embodiments, x-ray optics shape and direct x-ray radiation from illumination source 110 to specimen 101. In some examples, the x-ray optics collimate or focus the x-ray beam onto measurement area 102 of specimen 101 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

Figure 7:
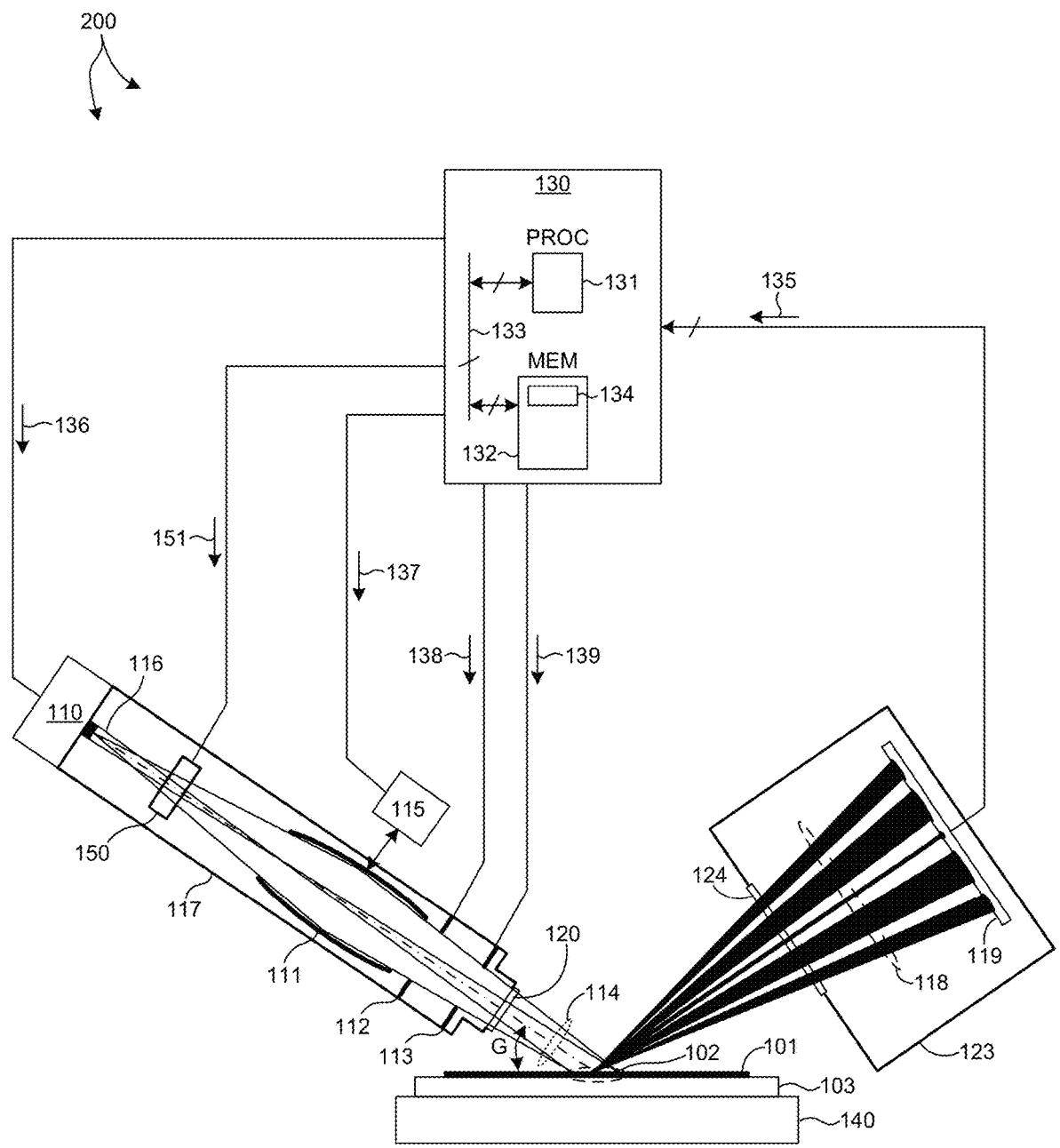
FIG. 7 depicts an illustration of a WR-SXR metrology system for measuring characteristics of a specimen in another embodiment.

FIG. 7 illustrates an embodiment of a WR-SXR metrology tool 200 for measuring characteristics of a specimen in another embodiment. As depicted in FIG. 7, focusing optics 111 focuses source radiation onto a metrology target located on specimen 101. The finite lateral source dimension results in finite spot size 102 on the target defined by the rays 116 coming from the edges of the source and any beam shaping provided by beam slits 112 and 113.

In some embodiments, focusing optics 111 includes elliptically shaped focusing optical elements. In the embodiment depicted in FIG. 7, the magnification of focusing optics 111 at the center of the ellipse is approximately one. As a result, the illumination spot size projected onto the surface of specimen 101 is approximately the same size as the illumination source, adjusted for beam spread due to the nominal grazing incidence angle (e.g., 1-45 degrees).

In a further aspect, focusing optics 111 collect source emission and select one or more discrete wavelengths or spectral bands, and focus the selected light onto specimen 101 at grazing angles of incidence in the range 1-45 degrees.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility WR-SXR measurements probe more deeply into the structure with less sensitivity to the precise value of the grazing incidence angle.

In some embodiments, focusing optics 111 include graded multi-layers that select desired wavelengths or ranges of wavelengths for projection onto specimen 101. In some examples, focusing optics 111 includes a graded multi-layer structure (e.g., layers or coatings) that selects one wavelength and projects the selected wavelength onto specimen 101 over a range of angles of incidence. In some examples, focusing optics 111 includes a graded multi-layer structure that selects a range of wavelengths and projects the selected wavelengths onto specimen 101 over one angle of incidence. In some examples, focusing optics 111 includes a graded multi-layer structure that selects a range of wavelengths and projects the selected wavelengths onto specimen 101 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 101, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.).

Figure 13:
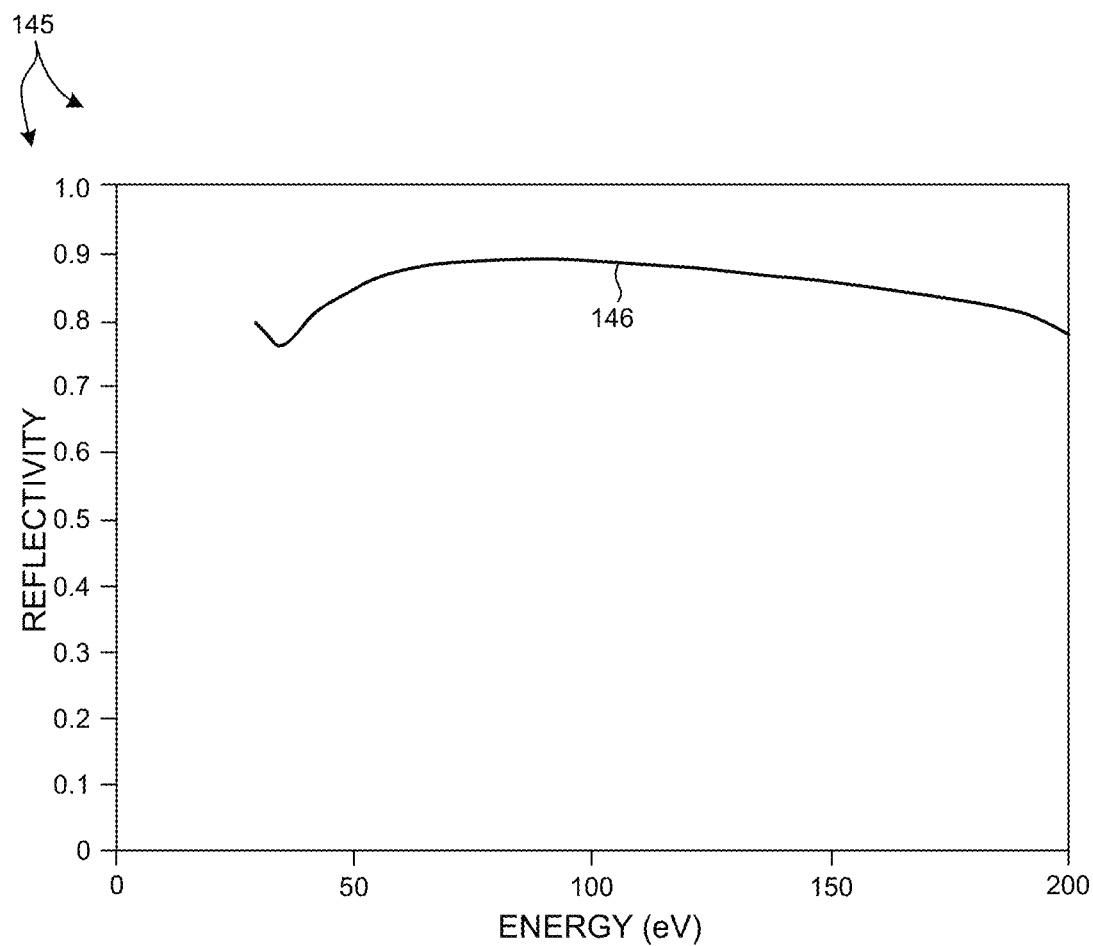
FIG. 13 depicts a plot illustrative of the reflectivity of a $Nb_2O_5$ mirror as a function of illumination beam energy.

In some embodiments, reflective multilayer optics based on a $Nb_2O_5$ mirror are employed. FIG. 13 depicts a plot 145 illustrative of the reflectivity 146 of a $Nb_2O_5$ mirror as a function of illumination beam energy. As illustrated in FIG. 13, reflectivity of 85%, or higher, is achieved over a broad range of x-ray beam energy. In some embodiments, $Nb_2O_5$ mirrors are beneficial when used in combination with a broadband X-ray source.

In a further aspect, the ranges of wavelengths, AOI, Azimuth, or any combination thereof, projected onto the same metrology area, are adjusted by actively positioning one or more mirror elements of the focusing optics 111. As depicted in FIG. 7, computing system 130 communicates command signals 137 to actuator system 115 that causes actuator system 115 to adjust the position, alignment, or both, of one or more of the optical elements of focusing optics 111 to achieve the desired ranges of wavelengths, AOI, Azimuth, or any combination thereof, projected onto specimen 101.

In general, the angle of incidence is selected to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an WR-SXR metrology system (e.g., metrology tool 200) includes one or more beam slits or apertures to shape the illumination beam 114 incident on specimen 101 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to limit overlap of diffraction orders on the detector.

FIG. 7 depicts a beam divergence control slit 112 located in the beam path between focusing optics 111 and beam shaping slit 113. Beam divergence control slit 112 limits the divergence of the illumination provided to the specimen under measurement. Beam shaping slit 113 is located in the beam path between beam divergence control slit 112 and specimen 101. Beam shaping slit 113 further shapes the incident beam 114 and selects the illumination wavelength(s) of incident beam 114. Beam shaping slit 113 is located in the beam path immediately before specimen 101. In one aspect, the slits of beam shaping slit 113 are located in close proximity to specimen 101 to minimize the enlargement of the incident beam spot size due to beam divergence defined by finite source size.

In some embodiments, beam shaping slit 113 includes multiple, independently actuated beam shaping slits. In one embodiment, beam shaping slit 113 includes four independently actuated beam shaping slits. These four beams shaping slits effectively block a portion of the incoming beam and generate an illumination beam 114 having a box shaped illumination cross-section.

Slits of beam shaping slit 113 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

In a further aspect, a WR-SXR metrology system as described herein employs one or more mechanisms to control illumination beam energy. In general, illumination beam energies are selected to ensure adequate X-ray penetration into the particular sample under measurement. In some examples, beam energies with smaller penetration are selected for measuring parameters closer to the surface. In these examples, the illumination beam energies only probe the structure on the surface without penetrating deep into the structure. In some examples beam energies with larger penetration are selected for measuring parameters deeper into the structure under measurement. In some examples, a combination of energies with low and high penetration is chosen to distinguish surface structure parameters against buried structure parameters.

In some embodiments, illumination beam energies are selected with an illumination source 110 tunable over a wide range of energies. In these embodiments, the illumination source itself emits illumination energies in the desired range(s). In some embodiments, illumination source 110 is a LPP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation. As depicted in FIG. 1, computing system 130 communicates command signals 136 to illumination source 110 that cause illumination source 110 to adjust the spectral range of wavelengths emitted from illumination source 110. In one example, illumination source 110 is a LPP light source, and the LPP light source adjusts any of a pulse duration, pulse frequency, and target material composition to realize a desired spectral range of wavelengths emitted from the LPP light source.

In some other embodiments, illumination beam energies are selected by one or more optical elements in the optical path between the illumination source and the specimen under measurement. In some embodiments, focusing optics 111 are selected to focus the illumination beam at the desired beam energy range(s) onto the specimen under measurement. In some embodiments, a beam energy filter 150 (depicted in FIG. 7) is located in the optical path between the illumination source and the specimen under measurement. The beam energy filter transmits the desired beam energy range(s) onto the specimen under measurement, and absorbs beam energies outside the desired beam energy range(s).

Figure 8:
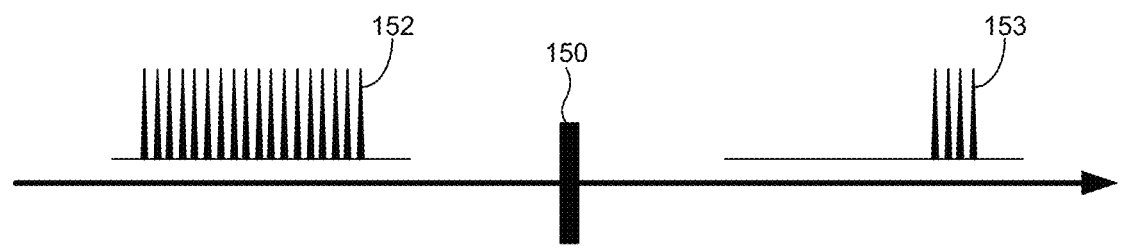
FIG. 8 depicts an illustration of an illumination beam of a WR-SXR metrology system passing through a beam energy filter in one embodiment.

FIG. 8 depicts an illustration of illumination beam 114 passing through beam energy filter 150 in one example. As depicted in FIG. 8, the wavelength spectrum 152 of incoming illumination beam 114 includes a large number of wavelength peaks. However, after passing through beam energy filter 150, the wavelength spectrum 153 of transmitted illumination beam 114 includes four distinct wavelength peaks.

Figure 9:
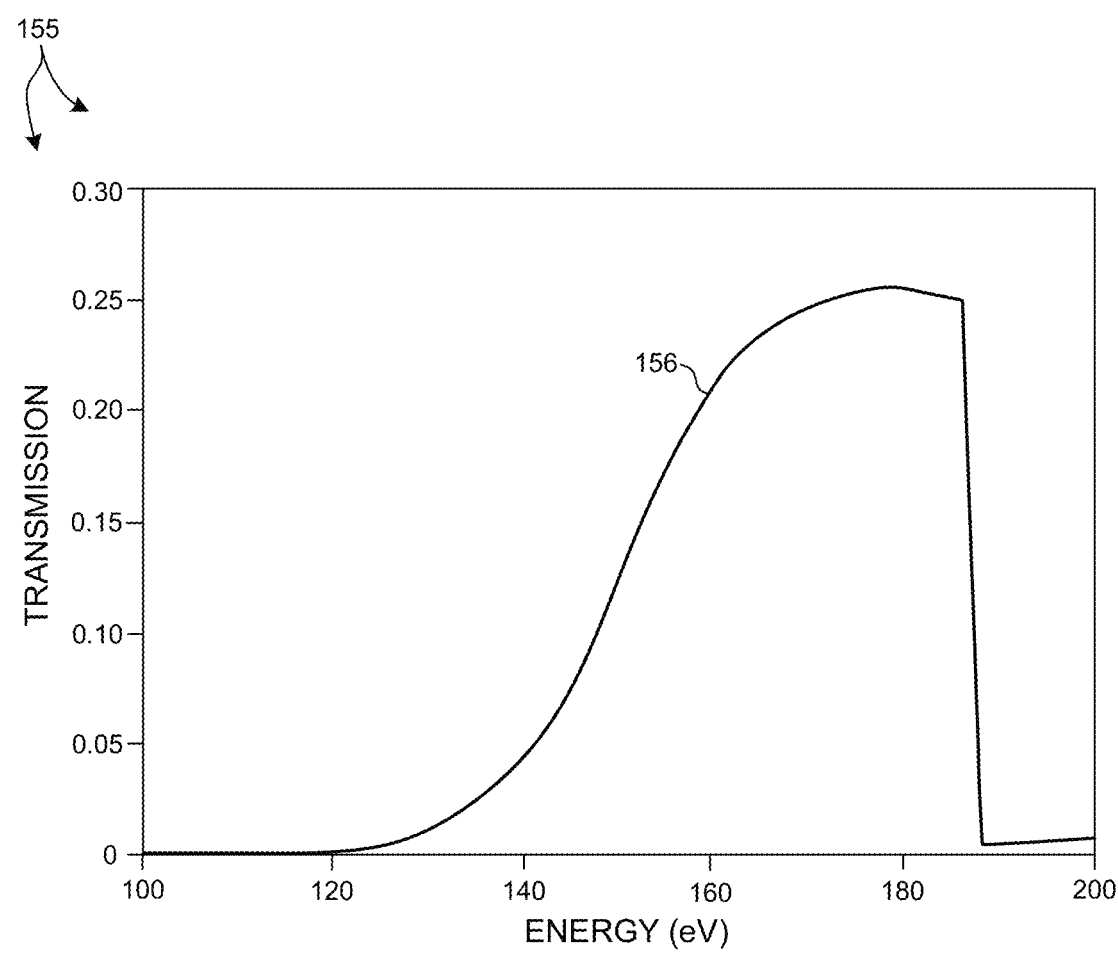
FIG. 9 depicts a plot illustrating the transmission curve of a beam energy filter fabricated from Boron and Tin layers of approximately 0.2 micrometer thickness deposited on a Kapton substrate.

FIG. 9 depicts a plot 155 illustrating the transmission curve 156 of a beam energy filter 150 fabricated from Boron and Tin layers of approximately 0.2 micrometer thickness deposited on a Kapton substrate. As depicted in FIG. 9, such a beam energy filter transmits beam energies in a range from approximately 140 eV to 190 eV, and rejects beam energies outside this band.

In a further aspect, the incident illumination beam of a WR-SXR metrology system is controlled to have relatively high divergence in one direction across the incident illumination beam and relatively low divergence in a second direction across the incident illumination beam, orthogonal to the first direction. In this manner, the spatial spread across the active surface of the detector in the direction of high divergence is orthogonal to the spatial spread across the active surface of the detector in the direction of low divergence. The spatial spread across the active surface of the detector in the direction of high divergence is dominated by angle of incidence due to relatively high divergence. Whereas, the spatial spread across the active surface of the detector in the direction of low divergence is dominated by wavelength dispersion within each diffraction order as described hereinbefore. In this manner, each non-zero diffraction order includes signal information about the structure under measurement due to spectral reflectivity (in the direction of low divergence) and angular reflectivity (in the direction of high divergence).

In some embodiments, the focusing optics of a WR-SXR system projects an image of the illumination source onto the specimen under measurement with a demagnification of at least five (i.e., magnification factor of 0.2 or less) in one direction across the incident illumination beam and no magnification in a second direction across the incidence illumination beam orthogonal to the first direction. In some embodiments, a WR-SXR system as described herein employs a SXR illumination source having a source area characterized by a lateral dimension of 20 micrometers or less (i.e., source size is 20 micrometers or smaller) having low output divergence (e.g., approximately 1 milliradian or less) in any direction across the illumination beam. In some embodiments, focusing optics are employed with a demagnification factor of at least five (i.e., project an image of the source onto the wafer that is five times smaller than the source size) in a first direction across the beam and no magnification in a second direction across the incidence illumination beam orthogonal to the first direction. In this example, the incident illumination beam is projected onto a specimen with an incident illumination spot size of twenty micrometers or less in the second direction and four micrometers or less in the first direction. In addition, the incident illumination beam is projected onto the specimen with an incident illumination beam divergence of 1 milliradian or less in the second direction and 5 milliradians or less in the first direction.

Figure 10:
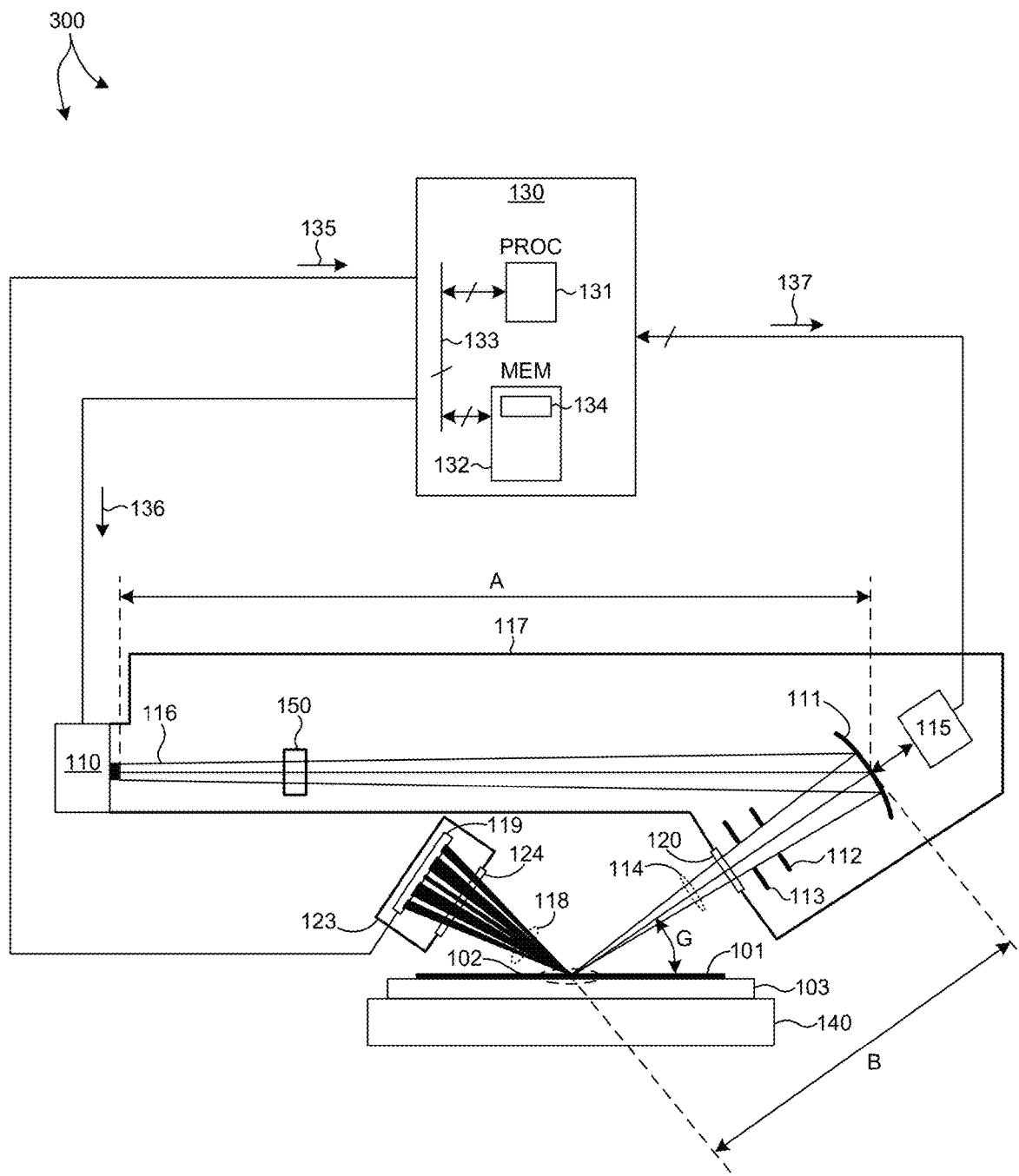
FIG. 10 depicts an illustration of a WR-SXR metrology system for measuring characteristics of a specimen in another embodiment.

FIG. 10 illustrates an embodiment of a WR-SXR metrology tool 300 in another embodiment. Like numbered elements depicted in FIG. 10 are analogous to those described with reference to FIGS. 1 and 7. As depicted in FIG. 10, focusing optic 111 is an elliptical optical element having curvature in one dimension. Focusing optic 111 is arranged with respect to illumination source 110 and specimen 101 such that the distance, A, between illumination source 110 and focusing optics 111 is significantly greater than the distance, B, between focusing optics 111 and specimen 101. In some embodiments, the ratio of A/B is at least five. In some embodiments, the ratio of A/B is at least ten. This results in a demagnification of the illumination source onto specimen 101 by a factor of A/B. In one embodiment, the size of illumination source 110 is approximately 10 micrometers and focusing optics 111 are arranged such that A/B is ten. The beam divergence of the illumination beam output by illumination source 110 is approximately 0.5 milliradians in any direction across the illumination beam. In this embodiment, the illumination spot size projected onto specimen 101 is approximately 1 micrometer in the direction across the beam subject to demagnification and approximately 10 micrometers in a second direction across the beam and orthogonal to the first direction not subject to demagnification. In addition, the incident illumination beam is projected onto the specimen with an incident illumination beam divergence of approximately 0.5 milliradians in the second direction and 5 milliradians in the first direction.

Figure 11:
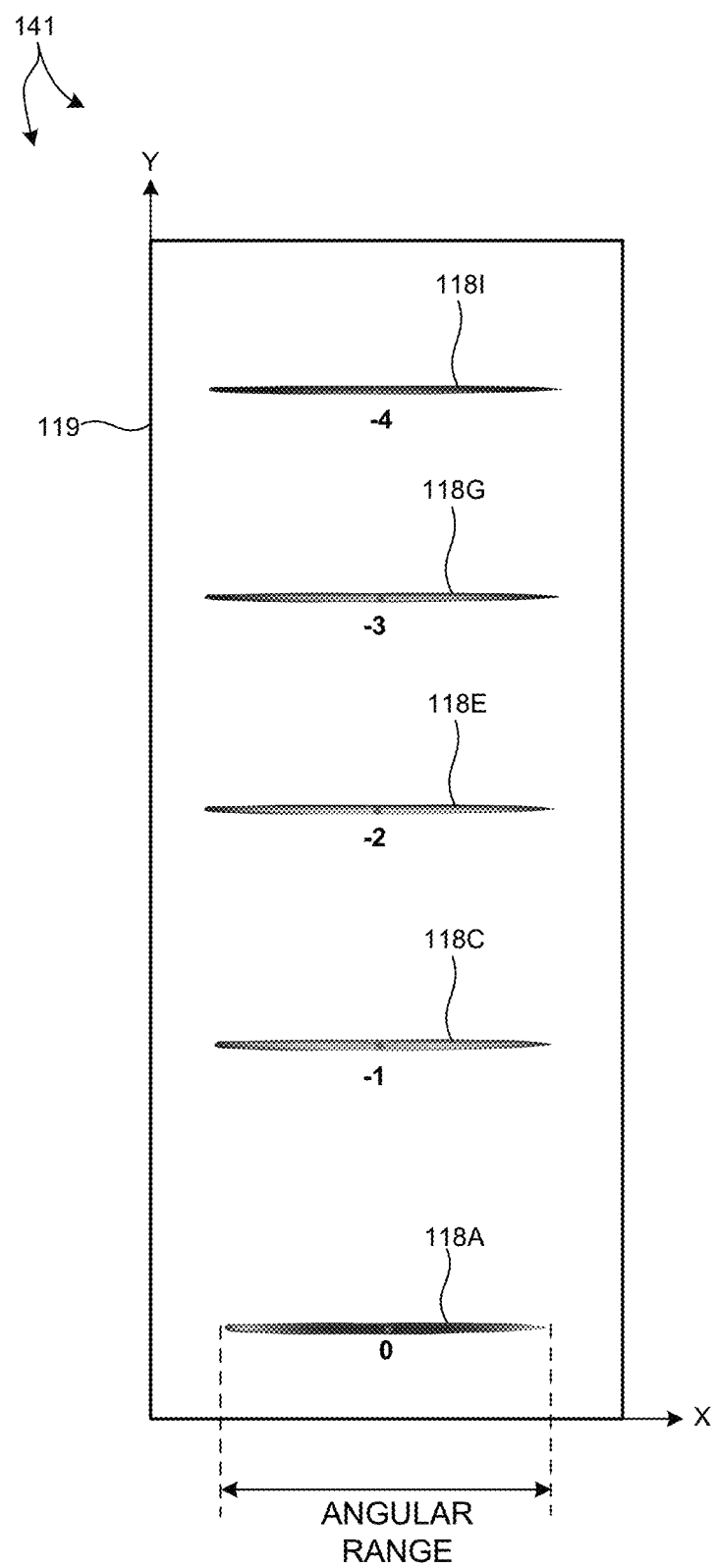
FIG. 11 depicts an illustration of scattered radiation incident on the active surface of the detector depicted in FIG. 10 for single wavelength illumination light.

FIG. 11 depicts an illustration 141 of scattered radiation 118 incident on the active surface of detector 119 as measured under the illumination conditions depicted in FIG. 10 for single wavelength illumination light. More specifically, FIG. 11 depicts, the $0^{th}$ order reflected beam 118A, diffracted radiation 118C corresponding to the −1 diffraction order, diffracted radiation 118E corresponding to the −2 diffraction order, diffracted radiation 118G corresponding to the −3 diffraction order, and diffracted radiation 118I corresponding to the −4 diffraction order. As depicted in FIG. 11, the single wavelength present in the illumination beam diffracts from periodic target 102 into each of the diffraction orders. There is very little spatial spread in the wavelength direction in the non-zero diffraction orders because the illumination light includes only one wavelength and beam divergence in this direction is relatively low (e.g., 0.5 milliradians). However, in the direction orthogonal to the wavelength direction, there is significant spatial spread across the angular range in all diffraction orders because beam divergence in this direction is relatively high (e.g., 5 milliradians).

Figure 12:
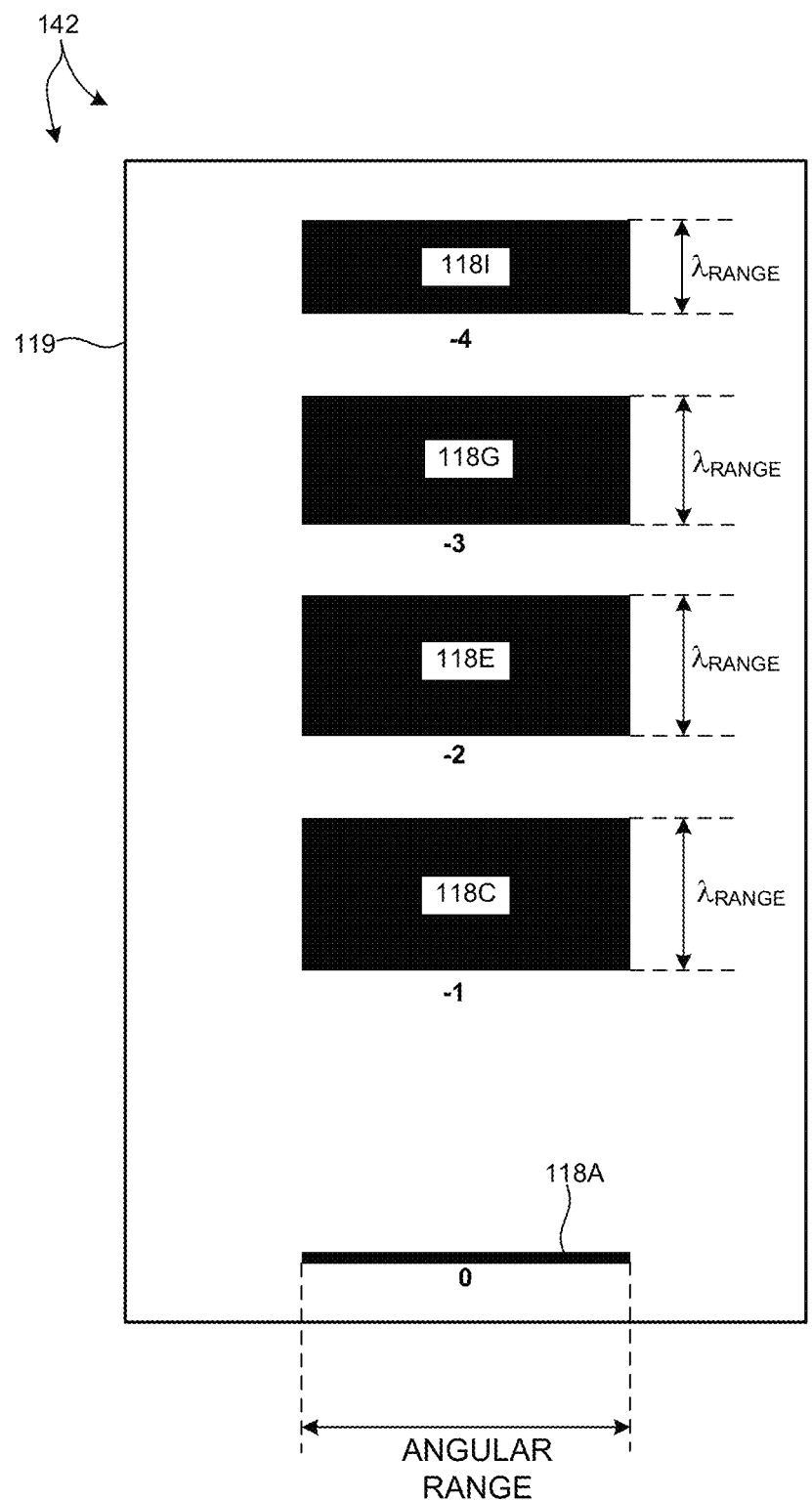
FIG. 12 depicts an illustration of scattered radiation 118 incident on the active surface of the detector depicted in FIG. 10 for broadband illumination light.

FIG. 12 depicts an illustration 142 of scattered radiation 118 incident on the active surface of detector 119 as measured under the illumination conditions depicted in FIG. 10 for broadband illumination light. More specifically, FIG. 12 depicts, the $0^{th}$ order reflected beam 118A, diffracted radiation 118C corresponding to the −1 diffraction order, diffracted radiation 118E corresponding to the −2 diffraction order, diffracted radiation 118G corresponding to the −3 diffraction order, and diffracted radiation 118I corresponding to the −4 diffraction order. As depicted in FIG. 12, the different wavelengths present in the illumination beam diffract from periodic target 102 at different angles within each of the non-zero diffraction orders. Thus, the range of wavelengths, $\lambda_{RANGE}$, present in illumination beam 114 is spatially spread in the y-direction for each of the non-zero diffracted orders. There is substantial spatial spread in the wavelength direction in the non-zero diffraction orders because the illumination light includes multiple, different wavelengths. Furthermore, beam divergence in this direction is relatively low (e.g., 0.5 milliradians), hence the wavelength information present in the y-direction is not significantly contaminated by angular information. However, in the x-direction, orthogonal to the wavelength direction, there is significant spatial spread across the angular range in all diffraction orders because beam divergence in this direction is relatively high (e.g., 5 milliradians). Thus, measurements performed at multiple wavelengths and with relatively high beam divergence across the beam in one direction and with relatively low beam divergence across the beam in a second direction orthogonal to the first direction provides both wavelength and angular signal information associated with the target under measurement.

U.S. Patent Publication No. 2019/0017946 describes a polychromatic soft x-ray reflectometer system that generally employs incident illumination with relatively high divergence, and is incorporated herein by reference it its entirety. However, such systems do not provide wavelength resolved diffracted signals as described herein.

In general, the X-ray collection path between the specimen under measurement and the detector of a WR-SXR metrology system may include any combination of elements used in the illumination path as described hereinbefore.

In some embodiments, slits blocking one or more diffraction orders are employed. In one embodiment, a metallic beam stop is employed to block the 0th order reflection.

In some embodiments, a spatial attenuator is located in the collection path to selectively attenuate a portion of the light associated with one or more diffraction orders (e.g., the 0th order) but not other orders. In this manner, all orders are measured at the same dynamic range on the detector simultaneously.

In general, the aforementioned optical elements located in the illumination path, collection path, or both, enable independent control of target size, photon flux, beam shape for each measurement.

In another further aspect, measurement performance is improved by flowing one or more liquid materials or one or more gaseous materials onto the target under measurement to increase contrast between measured materials. Further description of these techniques is provided in U.S. Pat. Nos. 10,281,263, 10,041,873, and 10,145,674, the contents of each are incorporated herein by reference in their entirety. In some embodiments, a vapor injection system provides a gaseous flow including a fill material in a vapor phase to the structure under measurement during the illumination of the structure. A portion of the fill material is condensed onto the structure in a liquid phase. The portion of the fill material fills at least a portion of a space between one or more geometric features of the structure.

In general, the target under measurement in accordance with the systems and methods described herein includes any periodic or semi-periodic structure at any step of a semiconductor fabrication process.

Figure 16A:
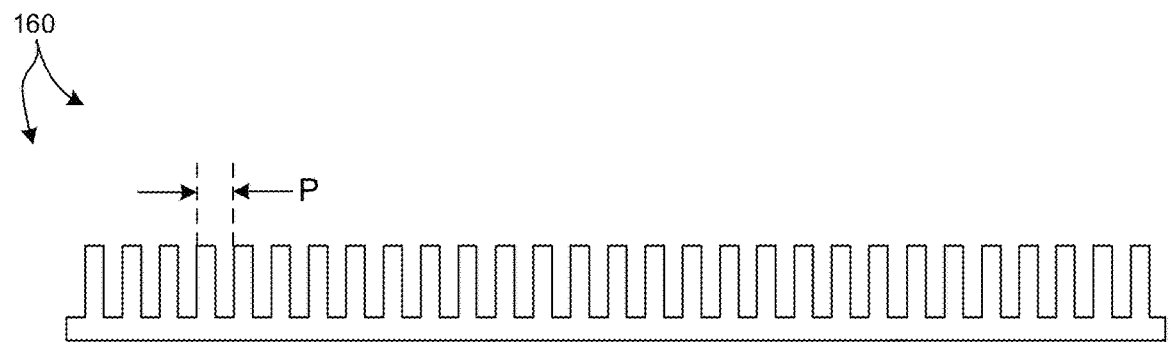
FIG. 16A is a diagram illustrative of a periodic metrology target in one example.
Figure 16B:
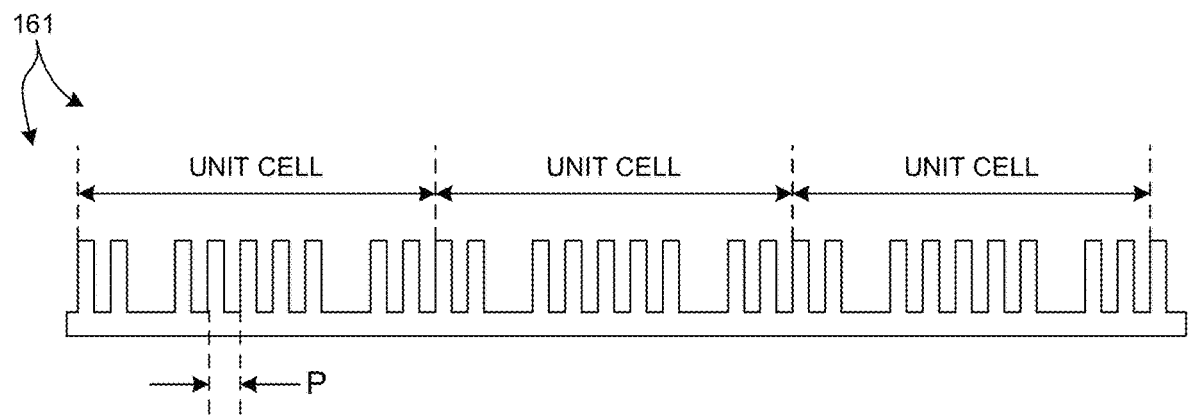
FIG. 16B is a diagram illustrative of a decimated metrology target in one example.

In some embodiments, a WR-SXR metrology system as described herein is employed to measure periodic metrology targets. For example, FIG. 16A depicts a metrology target 160 having a periodic grating structure having a pitch, P. However, in another aspect, a WR-SXR metrology system as described herein is employed to measure decimated metrology targets that exhibit both periodicity and aperiodicity. A decimated metrology target is a metrology target including an array of nominally periodic unit cells, and one or more cells of the nominally periodic array are deleted, displaced, or structurally modified at programmed or random locations within the array. For example, FIG. 16B depicts a metrology target 161 having a nominally periodic grating structure of pitch, P. However, in addition, specific fins of the grating structure are not present in metrology target 161. As a result, angular distribution of scattering from metrology target 161 under measurement exhibits both periodic properties, leading to localized diffraction peaks, and aperiodic behavior, also known as diffuse scattering.

In general, the distribution of diffuse scattering between Bragg peaks is increased by deleting elements of a nominally periodic unit cell array in a random or programmed manner. Diffuse intensity angular distribution is proportional to the structure factor squared. When decimated metrology targets are employed, Bragg peak intensity decreases, but more pixels include non-zero information content as the scattered light is spread over more pixels. Since model-based measurements are able to use information from all pixels, the overall increase in information content of the measurement improves measurement precision and accuracy. In general, Bragg peak intensity decreases as the fraction of deleted cells increases. The desired decimation of the metrology target maximizes overall measurement information content. In some examples, decimated metrology targets resolve ambiguity that occurs in cases where the structure factor of a metrology target is zero at a large subset of Bragg peak locations (e.g., a square wave at 50% duty cycle). A WR-SXR metrology system may be employed to measure a decimated metrology target in a sequential, single wavelength mode of operation or in a simultaneous, multiple wavelength mode of operation.

In some embodiments, a metrology target includes a general or specific aperiodicity selected to maximize signal information and thus minimize acquisition time. Design rules for logic standard cell arrays place primitive elements on a fixed grid and control pattern density variations within narrow ranges. Metrology of logic structures is focused on achieving a high precision estimate of average feature size and separation in a local region. Occupancy and periodicity is not of interest because these aspects are well controlled in the lithography process. A metrology target for logic structures optimizes the distribution of intensity such that scattering flux is increased in angular regions which contain high information content with respect to the desired feature parameter set. In one example, a metrology target includes a border region to enhance the information content of diffraction by a central region.

In another further aspect, a WR-SXR metrology system employs multiple detectors. In some embodiments, one or more diffraction orders are collected by a first detector, and other diffraction orders are collected by another detector.

Figure 14:
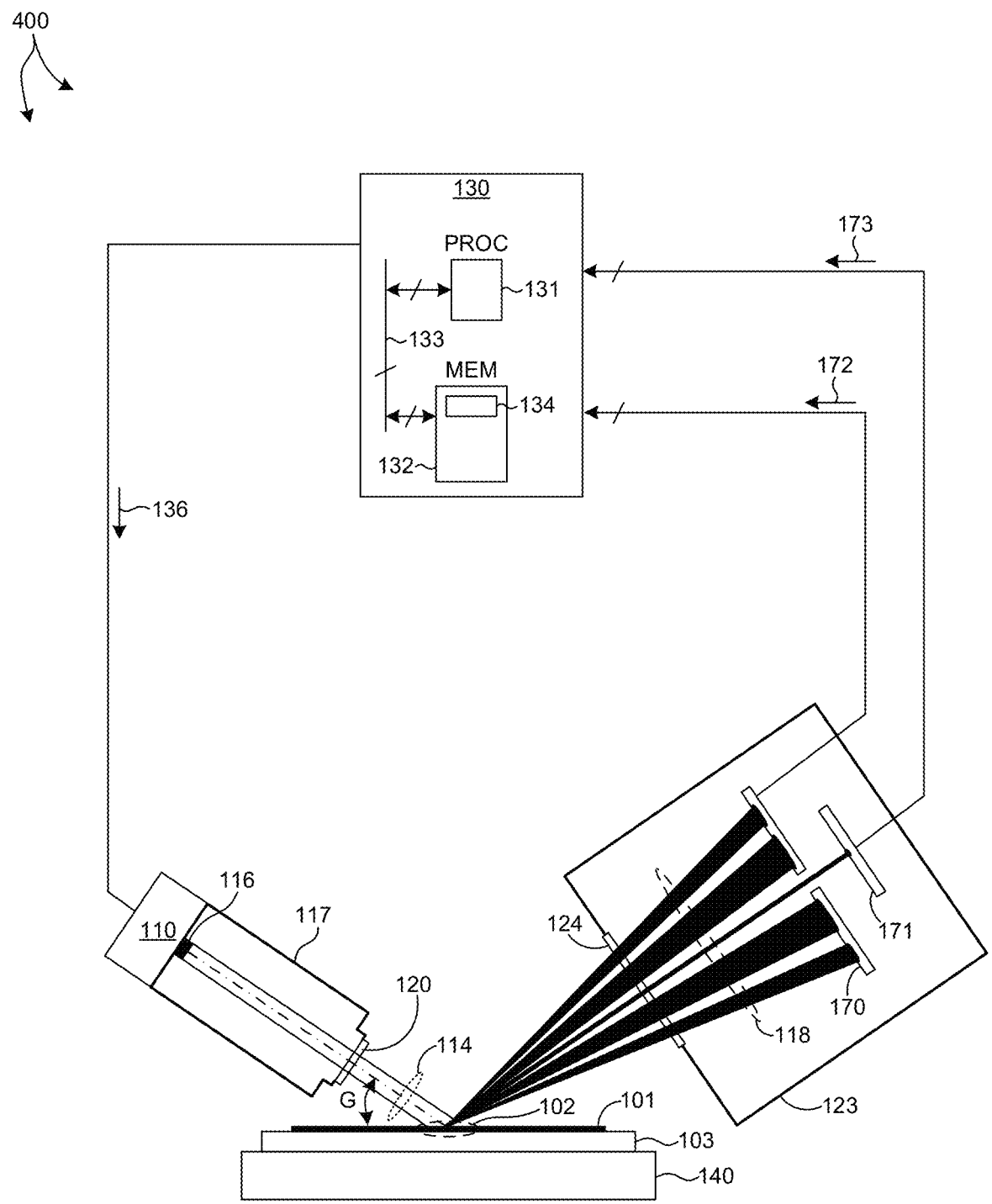
FIG. 14 depicts an illustration of a WR-SXR metrology system for measuring characteristics of a specimen in another embodiment.

FIG. 14 depicts a WR-SXR metrology system 400 in another embodiment. As depicted in FIG. 14, the active surface of detector 170 is located in the optical path of the non-zero diffraction orders, and the active surface of detector 171 is located in the optical path of the zero diffraction orders. In the embodiment depicted in FIG. 14, detector 170 includes an aperture that is transparent or semi-transparent or a void that passes the $0^{th}$ diffraction order to detector 171. As depicted in FIG. 14, detected signals 172 generated by detector 170 and detected signals 173 generated by detector 171 are communicated to computing system 130.

In some embodiments, detector 170 is configured to measure X-ray wavelengths, and detector 171 is configured to measure X-ray wavelengths, ultraviolet wavelengths, visible wavelengths, infrared wavelengths, or any combination thereof. In the embodiment depicted in FIG. 14, detector 171 is located within vacuum chamber 123. This embodiment is suitable for measurement configurations that involve detection of radiation by detector 171 including soft x-rays. However, in some other embodiments, detector 171 is located outside vacuum chamber 123. These embodiments are suitable for measurement configurations that involve detection of radiation by detector 171 that does not include soft x-rays (e.g., longer wavelengths such as ultraviolet, visible, infrared, etc.).

In a further aspect, the position of a detector of a WR-SXR metrology system is actively controlled to capture radiation reflected by the target under measurement. In some embodiments, computing system 130 communicates control commands (not shown) to actuators (not shown) coupled to detector 119 that cause the active surface of detector 119 to be tilted or translated with respect to the collected light.

In some embodiments, WR-SXR enables measurements on design-rule targets because the illumination wavelength(s) are shorter than the period of the measured structures. This provides a significant benefit over existing technology where measurements are performed on larger than the design rule targets. Use of WR-SXR wavelengths permits target design at process design rules, i.e., no "non-zero offsets".

A metrology target for WR-SXR measurements may include one dimensional periodic arrays or two dimensional periodic arrays. Parameters of interest measured by WR-SXR include but are not limited to dimensional information about a sample (e.g. layer thicknesses, grating heights, critical dimensions, side wall angles, overlay, etch placement error) and material information (e.g. material composition).

In some embodiments, illumination source 110 is an LPP light source having a source size of 10 micrometers, or less, and focusing optics 111 have a demagnification factor of approximately 10. This enables WR-SXR metrology tool 300 to focus illumination light onto a metrology target having dimensions of 1-2 micrometers. By focusing incident illumination light to an illumination spot size of 1-2 micrometers, WR-SXR metrology tool 300 enables the measurement of critical dimension targets and overlay targets located in-die, rather than relying on larger metrology targets located in the wafer scribe line areas.

The ability to measure targets having dimensions of 1-2 micrometers reduces the wafer area committed to specialized metrology targets. In addition, the ability to measure targets having dimensions of 1-2 micrometers enables the direct measurement of device structures, rather than specialized metrology targets. Measuring device structures directly eliminates target-to-device bias. This significantly improves measurement quality. In addition, measurements of in-die targets enable characterization of parameter variation within-die. Exemplary parameters of interest include critical dimensions, overlay, and edge placement errors, such as end line shortening, line to contact distance, etc.

In some embodiments, x-ray illumination source 110, focusing optics 111, slits 112 and 113, or any combination thereof, are maintained in the same atmospheric environment as specimen 101 (e.g., gas purge environment). However, in some embodiments, the optical path length between and within any of these elements is long and x-ray scattering and absorption in air contributes noise and signal attenuation to the image on the detector. Hence in some embodiments, any of x-ray illumination source 110, focusing optics 111, and slits 112 and 113 are maintained in a localized, vacuum environment. In the embodiment depicted in FIG. 7, illumination source 110, focusing optics 111, and slits 112 and 113 are maintained in a controlled environment (e.g., vacuum) within an evacuated flight tube 117. The illumination beam 114 passes through window 120 at the end of flight tube 117 before incidence with specimen 101.

Similarly, in some embodiments, the optical path length between specimen 101 and detector 119 (i.e., the collection beam path) is long and x-ray scattering and absorption in air contributes noise and attenuation to the image on the detector. Hence, in preferred embodiments, a significant portion of the collection beam path length between specimen 101 and detector 119 is maintained in a localized vacuum environment separated from the specimen (e.g., specimen 101) by a vacuum window (e.g., vacuum window 124). In some embodiments, x-ray detector 119 is maintained in the same localized vacuum environment as the beam path length between specimen 101 and detector 119. For example, as depicted in FIG. 7, vacuum chamber 123 maintains a localized vacuum environment surrounding detector 119 and a significant portion of the beam path length between specimen 101 and detector 119.

In some other embodiments, x-ray detector 119 is maintained in the same atmospheric environment as specimen 101 (e.g., gas purge environment). This may be advantageous to remove heat from detector 119. However, in these embodiments, it is preferable to maintain a significant portion of the beam path length between specimen 101 and detector 119 in a localized vacuum environment within a vacuum chamber.

In some embodiments, the entire optical system, including specimen 101, is maintained in vacuum. However, in general, the costs associated with maintaining specimen 101 in vacuum are high due to the complexities associated with the construction of specimen positioning system 140.

In another further aspect, computing system 130 is configured to generate a structural model (e.g., geometric model, material model, or combined geometric and material model) of a measured structure of a specimen, generate a WR-SXR response model that includes at least one geometric parameter from the structural model, and resolve at least one specimen parameter value by performing a fitting analysis of WR-SXR measurement data with the WR-SXR response model. The analysis engine is used to compare the simulated WR-SXR signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 15:
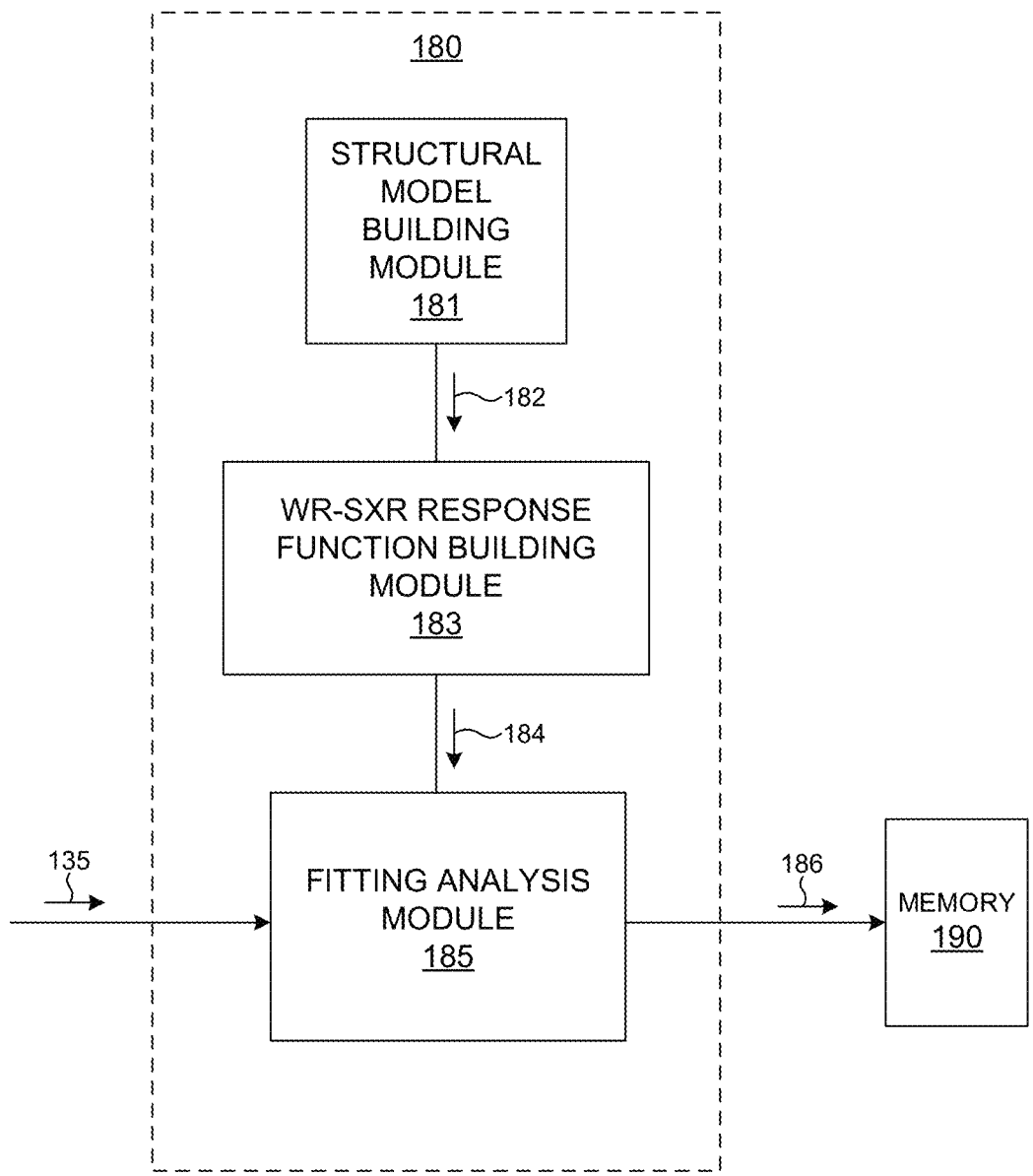
FIG. 15 is a diagram illustrative of an exemplary model building and analysis engine implemented by a computing system of a WR-SXR metrology system.

FIG. 15 is a diagram illustrative of an exemplary model building and analysis engine 180 implemented by computing system 130. As depicted in FIG. 15, model building and analysis engine 180 includes a structural model building module 181 that generates a structural model 182 of a measured structure of a specimen. In some embodiments, structural model 182 also includes material properties of the specimen. The structural model 182 is received as input to WR-SXR response function building module 183. WR-SXR response function building module 183 generates a WR-SXR response function model 184 based at least in part on the structural model 182. The fitting analysis module 185 compares the modeled WR-SXR response with the corresponding measured data to determine geometric as well as material properties of the specimen.

In some examples, the fitting of modeled data to experimental data is achieved by minimizing a chi-squared value. For example, for WR-SXR measurements, a chi-squared value can be defined as $$\chi^2_{SXR} = \frac{1}{N_{SXR}} \sum_j^{N_{SXR}} \frac{(S_j^{SXR\ model}(v_1, \ldots, v_L) - S_j^{SXR\ experiment})^2}{\sigma^2_{SXR,j}} \quad (2)$$

Where, $S_j^{SXR\ experiment}$ is the measured WR-SXR signals 126 in the "channel" j, where the index j describes a set of system parameters such as diffraction order, energy, angular coordinate, etc. $S_j^{SXR\ model}(V_1, \ldots, V_L)$ is the modeled WR-SXR signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SXR,j}$ is the uncertainty associated with the jth channel. $N_{SXR}$ is the total number of channels in the x-ray metrology. L is the number of parameters characterizing the metrology target.

Equation (2) assumes that the uncertainties associated with different channels are uncorrelated. In examples where the uncertainties associated with the different channels are correlated, a covariance between the uncertainties, can be calculated. In these examples a chi-squared value for WR-SXR measurements can be expressed as $$\chi^2_{SXR} = \frac{1}{N_{SXR}} \left(\vec{S}_j^{sXR\cdot model}(v_1, \ldots, v_M) - \vec{S}_j^{sXR\cdot experiment}\right)^T \quad (5)$$
$$V^{-1}_{SXR}\left(\vec{S}_j^{sXR\cdot model}(v_1, \ldots, v_M) - \vec{S}_j^{sXR\cdot experiment}\right)$$

where, $V_{SXR}$ is the covariance matrix of the WR-SXR channel uncertainties, and T denotes the transpose.

In some examples, fitting analysis module 185 resolves at least one specimen parameter value by performing a fitting analysis on WR-SXR measurement data 135 with the WR-SXR response model 184. In some examples, $\chi_{SXR}^2$ is optimized.

As described hereinbefore, the fitting of WR-SXR data is achieved by minimization of chi-squared values. However, in general, the fitting of WR-SXR data may be achieved by other functions.

In another further aspect, computing system 130 is configured to train an input-output model (e.g., a neural network model, a signal response metrology model, etc.) that maps WR-SXR measurement data to values of one or more parameters of interest characterizing the structure under measurement (e.g., a geometric parameter describing the structure under measurement). Furthermore, computing system 130 is configured to employ the input-output model to estimate values of parameters of interest based on WR-SXR measurement data.

WR-SXR data can be analyzed by a number of data fitting and optimization techniques and technologies including: libraries, fast-reduced-order models, regression, machine-learning algorithms such as neural networks and support-vector machines (SVM), dimensionality-reduction algorithms, e.g., PCA (principal component analysis), ICA (independent component analysis), and LLE (local-linear embedding), sparse representation such as Fourier or wavelet transform, Kalman filter, algorithms to promote matching from same or different tool types, and others.

WR-SXR data can also be analyzed by algorithms that do not include modeling, optimization, and/or fitting, e.g., U.S. Patent Publication No. 2015/0204664 and U.S. Patent Publication No. 2016/0216197, by Bringoltz, et al., the contents of each are incorporated herein by reference in their entireties.

The analysis of WR-SXR metrology data is advantageous for any type of WR-SXR technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing WR-SXR beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101.

In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on WR-SXR measurements performed at a single orientation of the incident x-ray beam with respect to the measurement target. The initial, estimated values are implemented as the starting values of the parameters of interest for a regression of the measurement model with measurement data collected from WR-SXR measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology tool 100 includes a computing system (e.g., computing system 130) configured to implement beam control functionality as described herein. In the embodiment depicted in FIG. 7, computing system 130 is configured as a beam controller operable to control any of the illumination properties such as intensity, divergence, spot size, polarization, spectrum, and positioning of the incident illumination beam 114.

As illustrated in FIG. 7, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 114 on specimen 101 is determined by computing system 130. In one example, pattern recognition techniques are applied by computing system 130 to determine the location and area of incidence of illumination beam 114 on specimen 101 based on measurement data 135. In some examples, computing system 130 communicates command signals 136 to x-ray illumination source 110 to select the desired illumination wavelength. In some examples, computing system 130 communicates command signals 137 to actuator subsystem 115 to redirect the x-ray emission to achieve a desired beam direction. In some examples, computing system 130 communicates command signals 138 and 139 to beam shaping slits 112 and 113, respectively, that cause beam shaping slits 112 and 113 to change the beam spot size and select illumination wavelengths such that incident illumination beam 114 arrives at specimen 101 with the desired beam spot size, orientation, and wavelength(s). In one example, command signals 138 and 139 cause actuators associated with slits 112 and 113 to change position to reshape the incident beam 114 to a desired shape and size and select desired wavelengths. In some examples, computing system 130 communicates command signals 151 to beam energy filter 150 that cause beam energy filter 150 to filter out undesired wavelengths from the spectrum of the illumination beam 114. In some other examples, computing system 130 communicates a command signal to wafer positioning system 140 to position and orient specimen 101 such that incident illumination beam 114 arrives at the desired location and angular orientation with respect to specimen 101.

In a further aspect, WR-SXR measurement data is used to generate an image of a measured structure based on the measured intensities of the detected diffraction orders. In some embodiments, a WR-SXR response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on WR-SXR measurements, WR-SXR measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 180 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the x-ray diffraction orders at the plurality of different angles of incidence and detected optical intensities with a combined, geometrically parameterized response model. The optical intensities are measured by an optical metrology tool that may or may not be mechanically integrated with an x-ray metrology system, such as systems 100 depicted in FIG. 1. Further details are described in U.S. Patent Publication No. 2014/0019097 and U.S. Patent Publication No. 2013/0304424, the contents of each are incorporated herein by reference it their entirety.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slits 112 and 113, focusing optics actuator system 115, specimen positioning system 140, and detector 119 in any manner known in the art. For example, the one or more computing systems 130 may be coupled to computing systems associated with the x-ray illumination source 110, beam shaping slits 112 and 113, focusing optics actuator system 115, specimen positioning system 140, and detector 119, respectively. In another example, any of the x-ray illumination source 110, beam shaping slits 112 and 113, focusing optics actuator system 115, specimen positioning system 140, and detector 119 may be controlled directly by a single computer system coupled to computer system 130.

The computer system 130 may be configured to receive and/or acquire data or information from the subsystems of the system (e.g., x-ray illumination source 110, beam shaping slits 112 and 113, focusing optics actuator system 115, specimen positioning system 140, detector 119, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, spectral results obtained using detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 17:
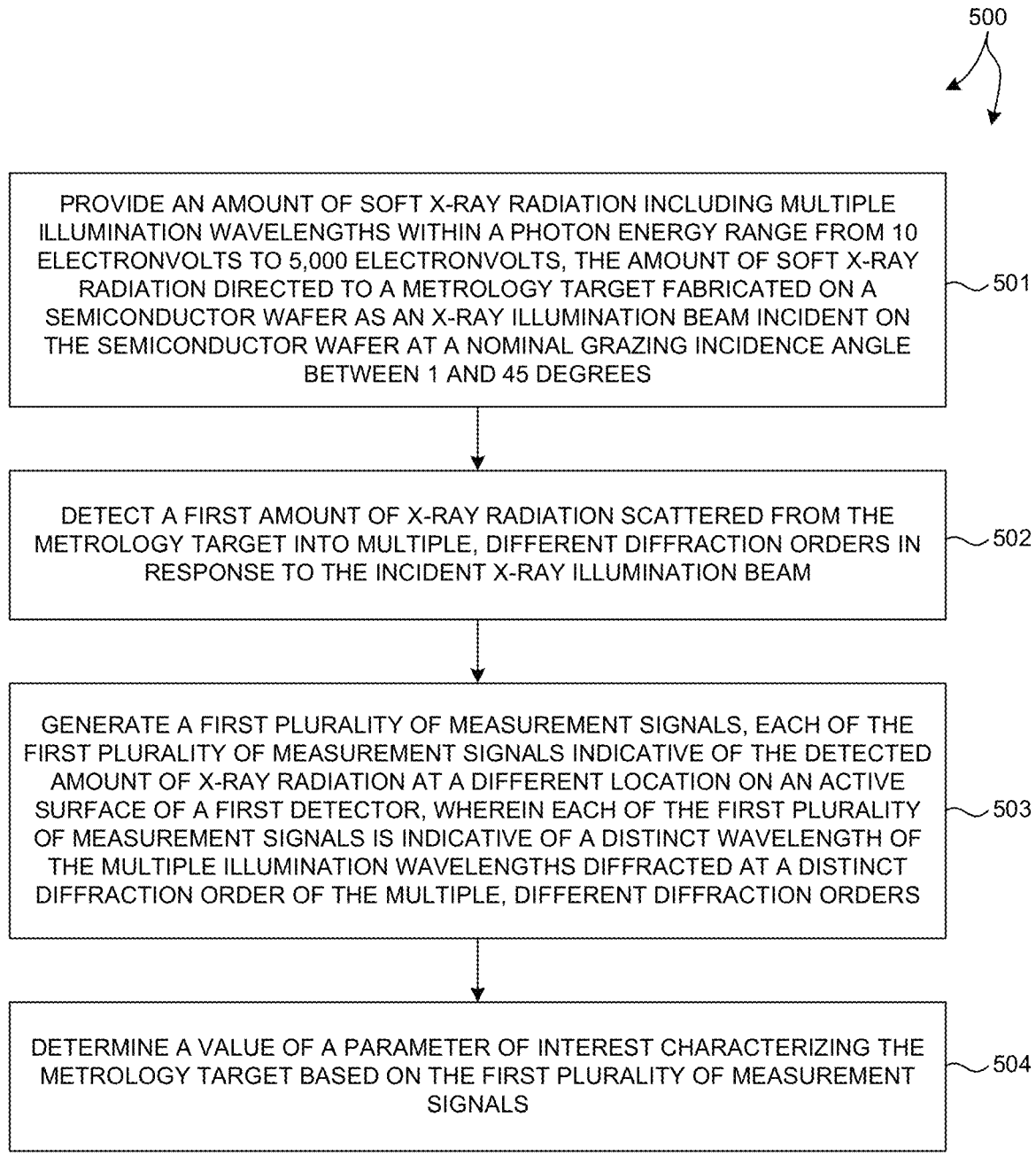
FIG. 17 is a flowchart illustrative of a method of performing wavelength resolved, soft x-ray reflectometry (WR-SXR) measurements of a specimen in one example.

FIG. 17 illustrates a method 500 suitable for implementation by the metrology systems 100, 200, 300, and 400 of the present invention. In one aspect, it is recognized that data processing blocks of method 500 may be carried out via a pre-programmed algorithm executed by one or more processors of computing system 130. While the following description is presented in the context of metrology systems 100, 200, 300, and 400, it is recognized herein that the particular structural aspects of metrology systems 100, 200, 300, and 400 do not represent limitations and should be interpreted as illustrative only.

In block 501, an amount of soft x-ray radiation is generated by an x-ray illumination source. The soft x-ray radiation includes multiple illumination wavelengths within a photon energy range from 10 electronvolts to 5,000 electronvolts. The amount of soft x-ray radiation is directed to a metrology target fabricated on a semiconductor wafer as an x-ray illumination beam incident on the semiconductor wafer at a nominal grazing incidence angle between 1 and 45 degrees.

In block 502, a first amount of x-ray radiation scattered from the metrology target into multiple, different diffraction orders is detected in response to the incident x-ray illumination beam.

In block 503, a first plurality of measurement signals is generated. Each of the first plurality of measurement signals is indicative of the detected amount of x-ray radiation at a different location on an active surface of a first detector. The first plurality of measurement signals is also indicative of a distinct wavelength of the multiple illumination wavelengths diffracted at a distinct diffraction order of the multiple, different diffraction orders.

In block 504, a value of a parameter of interest characterizing the metrology target is determined based on the plurality of measurement signals.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a WR-SXR analysis are used to control a fabrication process. In one example, WR-SXR measurement data collected from one or more targets is sent to a fabrication process tool. The WR-SXR measurement data is analyzed as described herein and the results used to adjust the operation of the fabrication process tool to reduce errors in the manufacture of semiconductor structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with WR-SXR measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
an x-ray illumination source configured to generate an amount of soft x-ray radiation including multiple illumination wavelengths within a photon energy range from 10 electronvolts to 5,000 electronvolts, the amount of soft x-ray radiation directed to a metrology target fabricated on a semiconductor wafer as an x-ray illumination beam incident on the semiconductor wafer at a nominal grazing incidence angle between 1 and 45 degrees;
a first detector disposed in an optical path of a first amount of x-ray radiation scattered from the metrology target into multiple, different diffraction orders in response to the incident x-ray illumination beam, the first detector configured to generate a first plurality of measurement signals, each of the first plurality of measurement signals is indicative of the detected amount of x-ray radiation at a different location on the first detector, wherein each of the first plurality of measurement signals is indicative of a distinct wavelength of the multiple illumination wavelengths diffracted at a distinct diffraction order of the multiple, different diffraction orders; and
a computing system configured to determine a value of a parameter of interest characterizing the metrology target based on the first plurality of measurement signals.

2. The metrology system of claim 1, further comprising:
a second detector disposed in an optical path of a second amount of x-ray radiation scattered from the metrology target into one or more different diffraction orders in response to the incident x-ray illumination beam, the second detector configured to generate a second plurality of measurement signals, each of the second plurality of measurement signals indicative of the detected amount of x-ray radiation at a different location on the second detector, wherein each of the second plurality of measurement signals is indicative of the one or more different diffraction orders, wherein the computing system is further configured to determine the value of the parameter of interest characterizing the metrology target is based on the first and second plurality of measurement signals.

3. The metrology system of claim 2, wherein the second amount of x-ray radiation includes radiation in any of a deep ultraviolet spectral range, a vacuum ultraviolet spectral range, a visible spectral range, and an infrared spectral range.

4. The metrology system of claim 1, further comprising:
one or more x-ray illumination optical elements disposed in an illumination optical path between the x-ray illumination source and the semiconductor wafer, wherein the one or more x-ray illumination optical elements focus the amount of soft x-ray radiation onto the semiconductor wafer as an x-ray illumination beam incident on the semiconductor wafer at a nominal grazing incidence angle between 1 and 45 degrees.

5. The metrology system of claim 1, wherein the x-ray illumination source is a High Harmonic Generation (HHG) laser based illumination source.

6. The metrology system of claim 1, further comprising:
a beam energy filter located in an optical path between the x-ray illumination source and the semiconductor wafer, wherein the beam energy filter transmits x-ray illumination within a desired beam energy range and absorbs x-ray illumination outside the desired beam energy range.

7. The metrology system of claim 1, wherein the x-ray illumination source emits the amount of soft x-ray radiation with a beam divergence of less than one milliradian.

8. The metrology system of claim 1, further comprising:
a demagnification optical element in an optical path between the x-ray illumination source and the semiconductor wafer, wherein the demagnification optical element focuses the x-ray illumination beam onto the semiconductor wafer with a magnification factor of 0.2 or less in a first direction across the x-ray illumination beam, and focuses the x-ray illumination beam onto the semiconductor wafer with a magnification factor of 0.9 or more in a second direction across the x-ray illumination beam orthogonal to the first direction.

9. The metrology system of claim 1, wherein the x-ray illumination source is further configured to emit radiation in any of a deep ultraviolet spectral range, a vacuum ultraviolet spectral range, a visible spectral range, and an infrared spectral range.

10. The metrology system of claim 1, wherein the x-ray illumination source has an illumination source area characterized by a dimension of maximum extent of less than 50 micrometers.

11. The metrology system of claim 1, wherein the parameter of interest is any of an overlay error, a critical dimension, and an edge placement error.

12. The metrology system of claim 1, further comprising:
a vapor injection system that provides a gaseous flow including a fill material in a vapor phase to the metrology target during the illumination of the metrology target.

13. The metrology system of claim 1, wherein the x-ray illumination source is adjusted to generate the amount of soft x-ray radiation including a desired photon energy range.

14. The metrology system of claim 1, further comprising:
one or more x-ray illumination optical elements disposed in an illumination optical path between the x-ray illumination source and the semiconductor wafer, wherein the one or more x-ray illumination optical elements focus the amount of soft x-ray radiation onto the semiconductor wafer as an x-ray illumination beam incident on the semiconductor wafer at a plurality of angles of incidence, a plurality of wavelengths, and a plurality of azimuth angles.

15. The metrology system of claim 14, wherein the one or more x-ray illumination optical elements are graded multi-layer optical elements that select the multiple illumination wavelengths.

16. A method comprising:
providing an amount of soft x-ray radiation including multiple illumination wavelengths within a photon energy range from 10 electronvolts to 5,000 electronvolts, the amount of soft x-ray radiation directed to a metrology target fabricated on a semiconductor wafer as an x-ray illumination beam incident on the semiconductor wafer at a nominal grazing incidence angle between 1 and 45 degrees;

detecting a first amount of x-ray radiation scattered from the metrology target into multiple, different diffraction orders in response to the incident x-ray illumination beam;

generating a first plurality of measurement signals, each of the first plurality of measurement signals indicative of the detected amount of x-ray radiation at a different location on an active surface of a first detector, wherein each of the first plurality of measurement signals is indicative of a distinct wavelength of the multiple illumination wavelengths diffracted at a distinct diffraction order of the multiple, different diffraction orders; and determining a value of a parameter of interest characterizing the metrology target based on the first plurality of measurement signals.

17. The method of claim 16, further comprising:

detecting a second amount of x-ray radiation scattered from the metrology target into one or more diffraction orders in response to the incident x-ray illumination beam; and generating a second plurality of measurement signals, each of the second plurality of measurement signals indicative of the detected amount of x-ray radiation at a different location on an active surface of a second detector, wherein each of the second plurality of measurement signals is indicative of the one or more diffraction orders, wherein the determining the value of the parameter of interest characterizing the metrology target is based on the first and second plurality of measurement signals.

18. The method of claim 17, wherein the second amount of x-ray radiation includes radiation in any of a deep ultraviolet spectral range, a vacuum ultraviolet spectral range, a visible spectral range, and an infrared spectral range.

19. The method of claim 17, further comprising:

filtering the x-ray illumination beam in an optical path between the x-ray illumination source and the semiconductor wafer.

20. The method of claim 17, further comprising:

demagnifying the x-ray illumination beam with a magnification factor of 0.2 or less in a first direction across the x-ray illumination beam; and projecting the x-ray illumination beam onto the semiconductor wafer with a magnification factor of 0.9 or more in a second direction across the x-ray illumination beam orthogonal to the first direction.

21. A metrology system comprising:

an x-ray illumination source configured to generate an amount of soft x-ray radiation including multiple illumination wavelengths within a photon energy range from 10 electronvolts to 5,000 electronvolts, the amount of soft x-ray radiation directed to a metrology target fabricated on a semiconductor wafer as an x-ray illumination beam incident on the semiconductor wafer;

a first detector disposed in an optical path of a first amount of x-ray radiation scattered from the metrology target into multiple, different diffraction orders in response to the incident x-ray illumination beam, the first detector configured to generate a first plurality of measurement signals, each of the first plurality of measurement signals indicative of the detected amount of x-ray radiation at a different location on the first detector, wherein each of the first plurality of measurement signals is indicative of a distinct wavelength of the multiple illumination wavelengths diffracted at a distinct diffraction order of the multiple, different diffraction orders;

a second detector disposed in an optical path of a second amount of x-ray radiation scattered from the metrology target into one or more different diffraction orders in response to the incident x-ray illumination beam, the second detector configured to generate a second plurality of measurement signals, each of the second plurality of measurement signals indicative of the detected amount of x-ray radiation at a different location on the second detector, wherein each of the second plurality of measurement signals is indicative of the one or more different diffraction orders; and a computing system configured to determine a value of a parameter of interest characterizing the metrology target based on the first and second plurality of measurement signals.

22. The metrology system of claim 21, wherein the second amount of x-ray radiation includes radiation in any of a deep ultraviolet spectral range, a vacuum ultraviolet spectral range, a visible spectral range, and an infrared spectral range.

* * * * *